(12) United States Patent
Masuda et al.

(10) Patent No.: US 12,451,388 B2
(45) Date of Patent: Oct. 21, 2025

(54) DIVIDING METHOD OF WORKPIECE

(71) Applicant: DISCO CORPORATION, Tokyo (JP)

(72) Inventors: Yohei Masuda, Tokyo (JP); Yoshinori Kakinuma, Tokyo (JP); Makoto Saito, Tokyo (JP); Kazuki Sugiura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 265 days.

(21) Appl. No.: 17/932,711

(22) Filed: Sep. 16, 2022

(65) Prior Publication Data

US 2023/0102150 A1    Mar. 30, 2023

(30) Foreign Application Priority Data

Sep. 30, 2021 (JP) .................................. 2021-161175

(51) Int. Cl.
*H01L 21/683* (2006.01)
*B28D 5/00* (2006.01)
*H01L 21/78* (2006.01)

(52) U.S. Cl.
CPC ........ *H01L 21/6836* (2013.01); *B28D 5/0029* (2013.01); *B28D 5/0052* (2013.01); *H01L 21/78* (2013.01); *H01L 2221/68327* (2013.01)

(58) Field of Classification Search
CPC .............. H01L 21/6836; H01L 21/78; H01L 21/67132; H01L 2221/68327; B28D 5/0029; B28D 5/0052
See application file for complete search history.

(56) References Cited

U.S. PATENT DOCUMENTS

| | | | |
|---|---|---|---|
| 9,105,708 B2 * | 8/2015 | Uchida | H01L 21/67132 |
| 2003/0064592 A1 * | 4/2003 | Yamamoto | H01L 21/67132 |
| | | | 438/689 |
| 2016/0244540 A1 | 8/2016 | Kamei | |
| 2018/0350641 A1 * | 12/2018 | Nakamura | B32B 38/10 |
| 2019/0071552 A1 | 3/2019 | Beyer et al. | |

(Continued)

FOREIGN PATENT DOCUMENTS

| | | |
|---|---|---|
| EP | 3951841 A1 | 2/2022 |
| JP | 06224239 A | 8/1994 |

(Continued)

OTHER PUBLICATIONS

JP_2019125598 translation (Year: 2019).*

(Continued)

*Primary Examiner* — Jonathan G Riley
(74) *Attorney, Agent, or Firm* — Greer, Burns & Crain, Ltd

(57) ABSTRACT

A tape is stuck to the front surface of a workpiece in such a manner that the direction in which the stretch rate becomes the lowest when a predetermined force is applied to the tape is non-parallel to each of multiple planned dividing lines extending in a lattice manner. In this case, each of the multiple planned dividing lines does not extend along the direction perpendicular to this direction. This can reduce the ratio of the region to which the tape does not stick in the front surface of the workpiece in the vicinity of the boundary between each of the multiple planned dividing lines and a region in which a device is formed and suppress deterioration of the processing quality when the workpiece is divided from the back surface side by a cutting blade.

4 Claims, 19 Drawing Sheets

(56) References Cited

U.S. PATENT DOCUMENTS

| | | | |
|---|---|---|---|
| 2020/0090976 A1* | 3/2020 | Wada | H01L 21/6836 |
| 2020/0212016 A1* | 7/2020 | Sakamoto | H01L 33/52 |
| 2020/0335396 A1* | 10/2020 | Yamamoto | H01L 21/681 |
| 2021/0252742 A1 | 1/2021 | Toda et al. | |
| 2021/0111061 A1* | 4/2021 | Yoshimura | H01L 21/67132 |

FOREIGN PATENT DOCUMENTS

| | | | | | |
|---|---|---|---|---|---|
| JP | 11330008 | A | 11/1999 | | |
| JP | 2013055137 | A | 3/2013 | | |
| JP | 6547819 | B2 | 7/2019 | | |
| JP | 2019125598 | A * | 7/2019 | | H04M 1/72508 |
| JP | 2020178064 | A | 10/2020 | | |

OTHER PUBLICATIONS

Office Action issued in counterpart German patent application No. 10 2022 210.064.6, dated May 10, 2023.
Office Action issued in counterpart German patent application No. 10 2022 210 064.6, dated May 25, 2023.
Japanese Patent Application 2021-+161175: English translation of Office Action, Jul. 1, 2025 (3 pages).
Singapore Patent Application No. 10202251044D: English translation of Office Action, Aug. 19, 2025 (4 pages).

* cited by examiner

DIVIDING METHOD OF WORKPIECE

BACKGROUND OF THE INVENTION

Field of the Invention

The present invention relates to a dividing method of a workpiece, in which the workpiece that is segmented into multiple regions by multiple planned dividing lines extending in a lattice manner and has a device formed on the front surface side of each of the multiple regions is divided by a cutting blade along each of the multiple planned dividing lines from the back surface side of the workpiece.

Description of the Related Art

Chips of devices such as integrated circuits (IC) and large scale integration (LSI) circuits are essential constituent elements in various kinds of electronic equipment such as mobile phones and personal computers. Such chips are manufactured by dividing a workpiece on which a large number of devices are formed on the front surface side is divided along planned dividing lines, for example.

For the dividing of such a workpiece, for example, a cutting apparatus including a cutting unit having a spindle with a tip part on which a circular annular cutting blade is mounted and a holding table that holds the workpiece is used. In this cutting apparatus, the workpiece is divided into multiple chips by bringing the cutting blade that rotates into contact with the workpiece along each of multiple planned dividing lines extending in a lattice manner.

However, to divide the workpiece into the multiple chips, the cutting blade needs to be caused to cut into the workpiece in such a manner that the cutting blade that rotates penetrates the workpiece. Furthermore, in this case, there is a fear that the holding table that holds the workpiece is cut and damaged by the cutting blade.

Thus, when the workpiece is divided into the multiple chips as above, a tape is stuck to the workpiece, and the workpiece is held by the holding table with the interposition of this tape in many cases. This can divide the workpiece into the multiple chips in a state in which the outer edge of the cutting blade that penetrates the workpiece is positioned inside the tape. As a result, damage to the holding table is prevented.

Furthermore, in this case, the tape is not divided in association with the dividing of the workpiece. That is, the multiple chips are integrated through the tape. Thus, the probability that several chips are scattered when the workpiece is divided into the multiple chips can be reduced. Moreover, in order to make handling of such a workpiece before and after the dividing easy, the workpiece is divided in a state of a work unit in which the workpiece is integrated with an annular frame through the tape in many cases.

For example, in a case of dividing a workpiece from the front surface side by a cutting blade, a work unit in which the workpiece and an annular frame are integrated through a tape sticking to the back surface of the workpiece is formed (for example, refer to Japanese Patent Laid-open No. H11-330008). Furthermore, in a case of dividing a workpiece from the back surface side by a cutting blade, a work unit in which the workpiece and an annular frame are integrated through a tape sticking to the front surface of the workpiece is formed (for example, refer to Japanese Patent Laid-open No. 2020-178064).

SUMMARY OF THE INVENTION

When devices are formed on the front surface side of a workpiece, the front surface of this workpiece becomes a recessed/protruding shape in many cases. Specifically, in each of multiple regions marked out by multiple planned dividing lines extending in a lattice manner in the front surface of the workpiece, stacked layers including various insulating films and electrically-conductive films are formed for configuring the devices.

On the other hand, for facilitating dividing of the workpiece along each of the multiple planned dividing lines extending in a lattice manner, such stacked layers are not formed in regions corresponding to the multiple planned dividing lines in the front surface of the workpiece in many cases. Due to this, the front surface of the workpiece has a recessed/protruding shape (the multiple regions in which the devices are formed are protruding parts and the regions corresponding to the multiple planned dividing lines are recessed parts).

Thus, to stick a tape to the whole of the front surface of such a workpiece, the tape needs to stretch to follow the recessed/protruding shape of the front surface of the workpiece. However, in such a tape, generally anisotropy exists in the stretch rate of the tape when a predetermined force is applied to the tape.

For example, the stretch rate of a tape when a predetermined force is applied to the tape in the tensile direction (machine direction (MD)) of the tape in manufacturing of the tape is lower than that of the tape when the predetermined force is applied to the tape in another direction such as the direction perpendicular to the tensile direction (transverse direction (TD)).

Furthermore, when planned dividing lines extend along the direction perpendicular to a direction in which the stretch rate of the tape is low (for example, tensile direction), the tape does not stick to the front surface of the workpiece in the vicinity of the boundary between this planned dividing line and the region in which the device is formed, in some cases. Moreover, when the workpiece is divided from the back surface side by a cutting blade in such a state, there is a fear that the processing quality when the workpiece is divided along this planned dividing line deteriorates.

In view of this point, an object of the present invention is to reduce the ratio of the region to which a tape does not stick in the front surface of a workpiece and suppress deterioration of the processing quality when the workpiece is divided from the back surface side by a cutting blade.

In accordance with an aspect of the present invention, there is provided a dividing method of a workpiece, in which the workpiece that is segmented into a plurality of regions by a plurality of first planned dividing lines each extending along a first direction and a plurality of second planned dividing lines each extending along a second direction intersecting the first direction and has a device formed on a side of a front surface of each of the plurality of regions is divided by a cutting blade from a side of a back surface of the workpiece along each of the plurality of first planned dividing lines and each of the plurality of second planned dividing lines. The dividing method includes a first work unit forming step of forming a first work unit in which the workpiece and a first annular frame are integrated by sticking a first tape with anisotropy in a stretch rate when a predetermined force is applied to the first tape to the first annular frame in such a manner as to cover an opening of the first annular frame and sticking the first tape to the front surface of the workpiece, a holding step of holding a side of the first tape of the first work unit by a holding table and exposing the back surface of the workpiece after the first work unit forming step, and a dividing step of dividing the workpiece by the cutting blade from the side of the back surface along each of the plurality of first planned dividing lines and each of the plurality of second planned dividing lines after the holding step. In the first work unit forming step, the first tape is stuck to the front surface of the workpiece in such a manner that a third direction in which the stretch rate becomes the lowest when the predetermined force is applied to the first tape is non-parallel to both the first direction and the second direction.

Moreover, in the present invention, it is preferable that the first direction be orthogonal to the second direction and that, in the first work unit forming step, the first tape be stuck to the front surface of the workpiece in such a manner that an angle formed by a straight line along the third direction and each of a straight line along the first direction and a straight line along the second direction is 45 degrees.

Furthermore, in the present invention, it is preferable to employ the following configuration. The dividing method further include a second work unit forming step of forming a second work unit in which the workpiece and a second annular frame having an outer edge at which a frame cutout is formed are integrated by separating the first tape from the workpiece after sticking a second tape to the second annular frame in such a manner as to cover an opening of the second annular frame and sticking the second tape to the back surface of the workpiece. A notch or an orientation flat for indicating a crystal orientation is formed at an outer edge of the workpiece. In the second work unit forming step, the second tape sticking to the second annular frame is stuck to the back surface of the workpiece in such a manner that an angle formed by a direction from the center of the workpiece toward the notch or the orientation flat and a direction indicated by the frame cutout is 0°, 90°, 180°, or 270°.

In the present invention, the first tape is stuck to the front surface of the workpiece in such a manner that the direction (third direction) in which the stretch rate becomes the lowest when the predetermined force is applied to the first tape is non-parallel to each of the multiple planned dividing lines extending in a lattice manner. In this case, each of the multiple planned dividing lines does not extend along the direction perpendicular to this direction.

This can reduce the ratio of the region to which the first tape does not stick in the front surface of the workpiece in the vicinity of the boundary between each of the multiple planned dividing lines and the region in which the device is formed and suppress deterioration of the processing quality when the workpiece is divided from the back surface side by the cutting blade.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
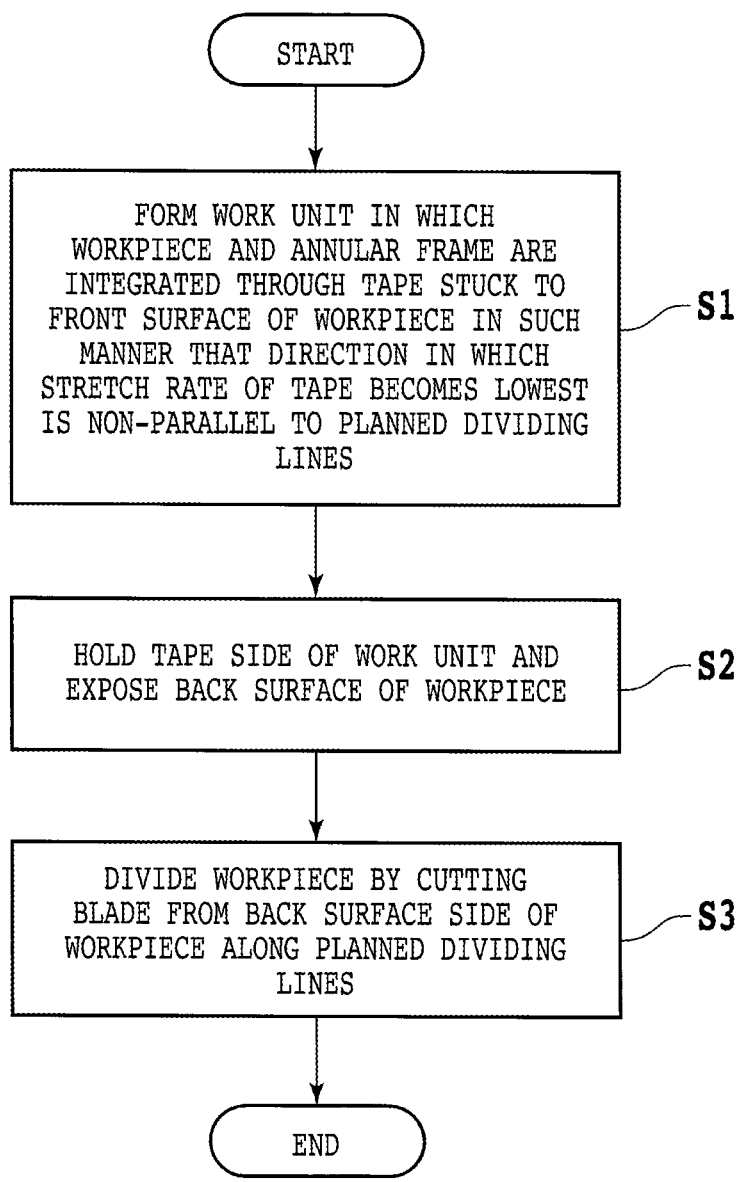
FIG. 1 is a flowchart schematically illustrating one example of a dividing method of a workpiece.

An embodiment of the present invention will be described with reference to the accompanying drawings. FIG. 1 is a flowchart schematically illustrating one example of a dividing method of a workpiece. In this method, first, a work unit in which the workpiece and an annular frame are integrated through a tape stuck to the front surface of the workpiece in such a manner that the direction in which the stretch rate of the tape is the lowest is non-parallel to planned dividing lines is formed (work unit forming step: S1).

Figure 2:
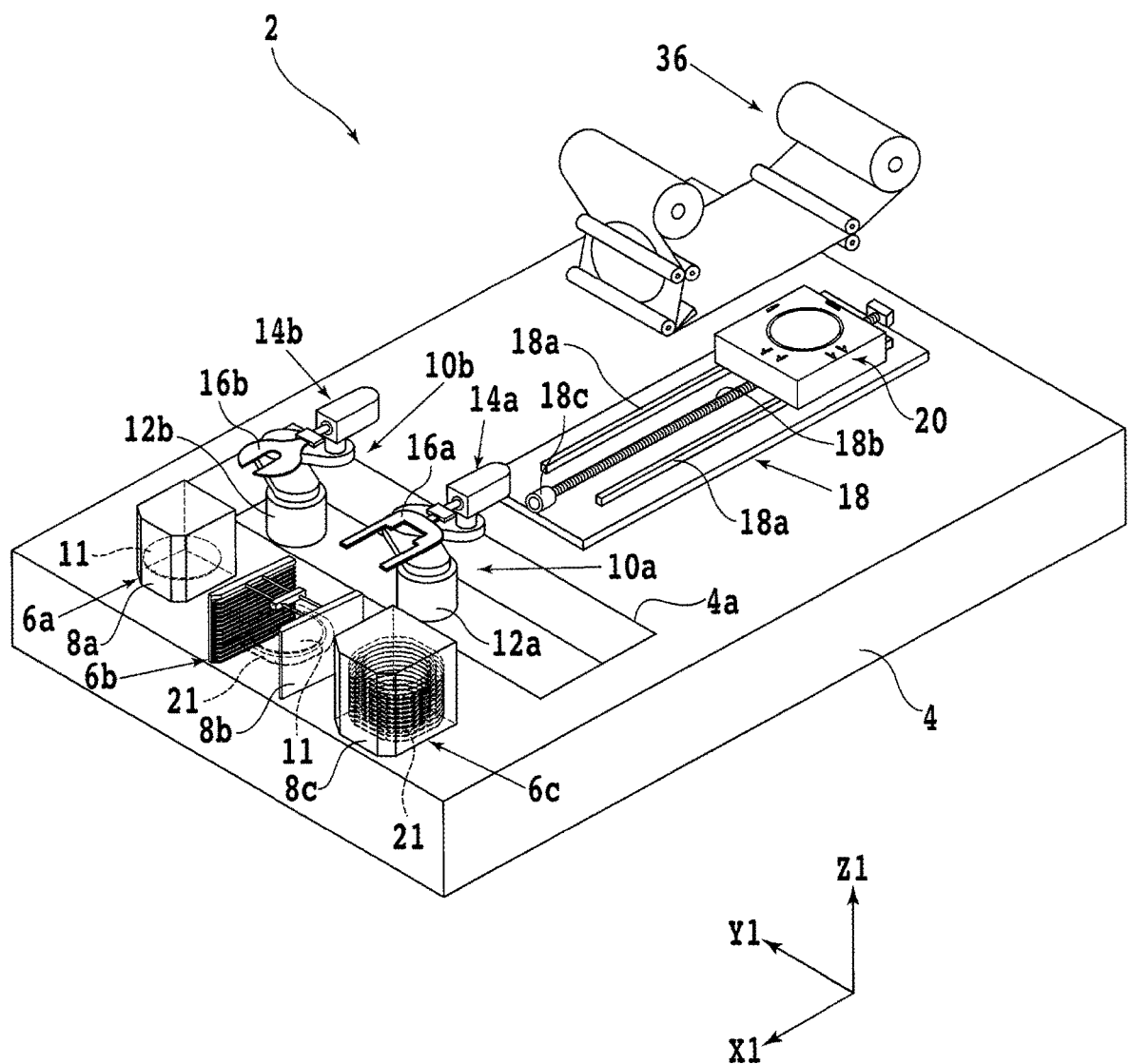
FIG. 2 is a perspective view schematically illustrating one example of a tape sticking apparatus used for executing a work unit forming step.

FIG. 2 is a perspective view schematically illustrating one example of a tape sticking apparatus used for executing the work unit forming step (S1). An X1-axis direction (front-rear direction) and a Y1-axis direction (left-right direction) illustrated in FIG. 2 are directions perpendicular to each other on a horizontal plane. Furthermore, a Z1-axis direction (upward-downward direction) is the direction perpendicular to the X1-axis direction and the Y1-axis direction (vertical direction).

A tape sticking apparatus 2 illustrated in FIG. 2 has a rectangular parallelepiped-shaped base 4 that supports the respective constituent elements. In a region on the front side of the upper surface of this base 4, three cassette placement pedestals 6a, 6b, and 6c are disposed to line up along the Y1-axis direction. Furthermore, on the cassette placement pedestal 6a, for example, a cassette 8a that houses the workpieces is placed.

Moreover, on the cassette placement pedestal 6b, for example, a cassette 8b that can house work units including the workpiece and an annular frame integrated through a tape in the tape sticking apparatus 2 is placed. In addition, on the cassette placement pedestal 6c, for example, a cassette 8c that houses the annular frames is placed.

Figure 3A:
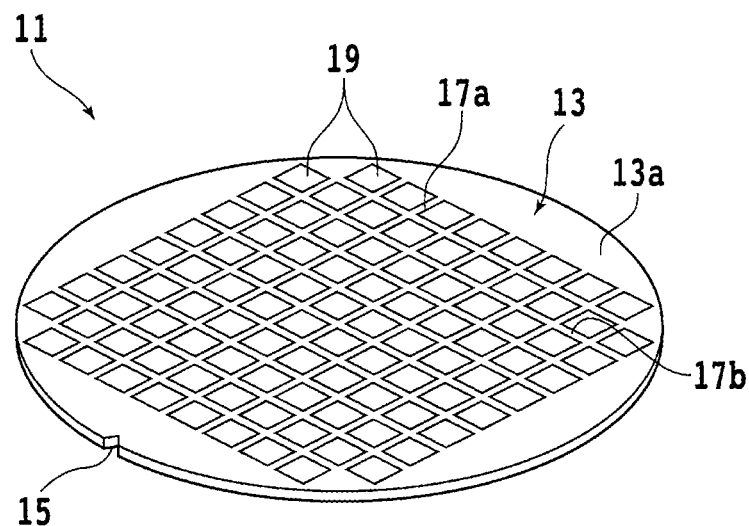
FIG. 3A is a perspective view schematically illustrating one example of a workpiece.

FIG. 3A is a perspective view schematically illustrating one example of the workpiece housed in the cassette 8a. A workpiece 11 illustrated in FIG. 3A has a circular disc-shaped substrate 13 composed of a single-crystal semiconductor material such as silicon (Si), silicon carbide (SiC), or gallium nitride (GaN).

A notch 15 for indicating a specific crystal orientation of the single-crystal semiconductor that configures the substrate 13 is formed at the outer edge of this substrate 13. Furthermore, an impurity region doped with an impurity is disposed at part of the side of a front surface 13a of the substrate 13.

Moreover, the workpiece 11 is segmented into multiple regions 19 by multiple planned dividing lines (first planned dividing lines) 17a that each extend along the same direction (first direction) and multiple planned dividing lines (second planned dividing lines) 17b that each extend along a second direction intersecting the first direction. The first direction is the direction parallel to the direction from the center of the substrate 13 toward the notch 15 and the second direction is the direction perpendicular to the direction from the center of the substrate 13 toward the notch 15. That is, the first direction is orthogonal to the second direction.

Furthermore, a device is formed in each of the multiple regions 19. This device is configured by part of the side of the front surface 13a of the substrate 13 (intrinsic semiconductor region in which an impurity does not exist and impurity region) and stacked layers including various insulating films and electrically-conductive films formed over the front surface 13a of the substrate 13.

Similar stacked layers are not formed in regions corresponding to the multiple planned dividing lines 17a and 17b in the front surface of the workpiece 11. Thus, the front surface of the workpiece 11 has a recessed/protruding shape (the multiple regions 19 in which the devices are formed are protruding parts, and the regions corresponding to the multiple planned dividing lines 17a and 17b are recessed parts).

Furthermore, there is no limit on the material, shape, structure, size, and so forth of the substrate 13. The substrate 13 may be composed of materials such as ceramic, resin, and metal, for example. Moreover, an impurity region is not disposed in the substrate 13 in some cases. In addition, at the outer edge of the substrate 13, a flat part for indicating a specific crystal orientation, what is called an orientation flat, may be formed instead of the notch.

Figure 3B:
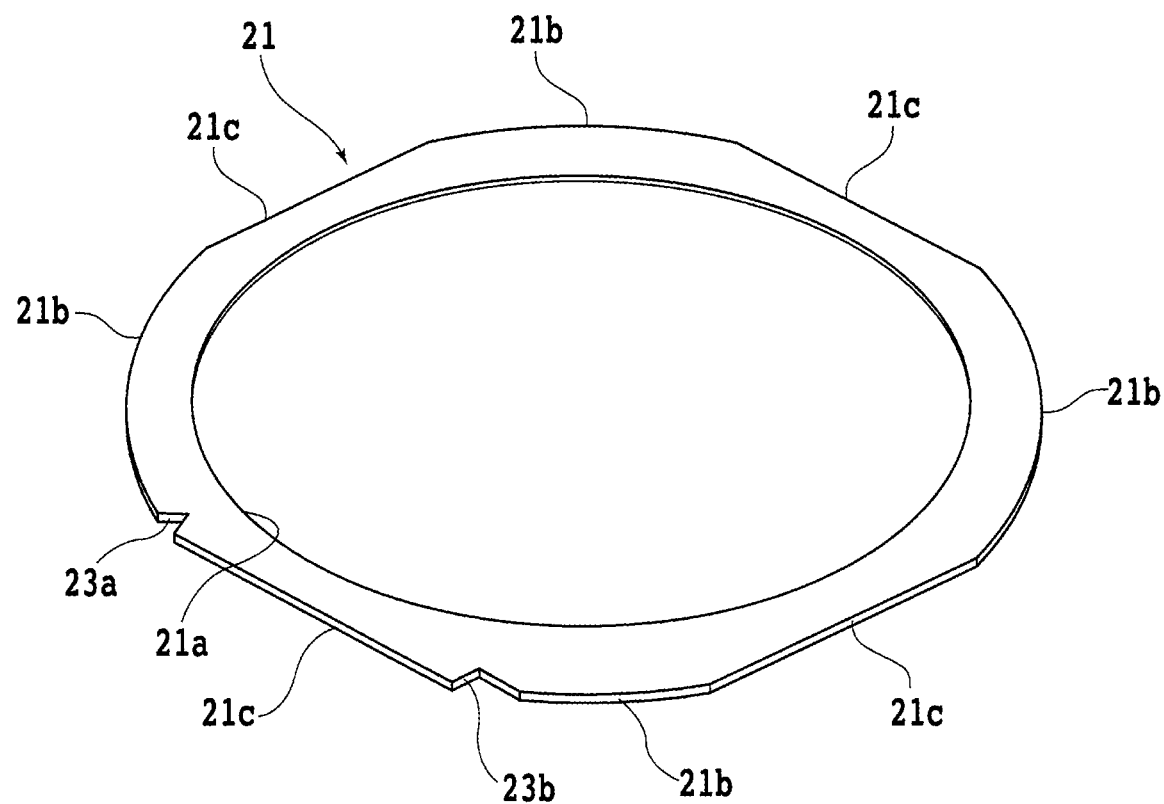
FIG. 3B is a perspective view schematically illustrating one example of an annular frame.

FIG. 3B is a perspective view schematically illustrating one example of the annular frame (first annular frame) housed in the cassette 8c. An annular frame 21 illustrated in FIG. 3B is composed of a metal material such as aluminum or stainless steel, for example. A circular opening 21a with a longer diameter than the workpiece 11 (substrate 13) is formed at a central part of this annular frame 21.

That is, the inner circumference of the annular frame 21 circularly extends and the diameter (inner diameter) thereof is longer than that of the workpiece 11 (substrate 13). Furthermore, the outer edge of the annular frame 21 includes four circular arc parts 21b that each extend in a circular arc manner and four straight line parts 21c that each extend in a straight line manner.

Moreover, the four circular arc parts 21b are disposed to overlap with a circle whose diameter is longer than the inner diameter of the annular frame 21 and whose center corresponds with the center of the opening 21a. In addition, the four circular arc parts 21b are disposed at substantially equal intervals along the circumferential direction of the annular frame 21.

Furthermore, the four straight line parts 21c are disposed to overlap with a square whose center corresponds with the center of the opening 21a. Each side of this square is longer than the inner diameter of the annular frame 21 and is shorter than the diameter of the circle that overlaps with the four circular arc parts 21b. In addition, each of the four straight line parts 21c is disposed between a pair of circular arc parts 21b adjacent along the circumferential direction of the annular frame 21.

Moreover, a pair of frame cutouts 23a and 23b are each formed between one of the four straight line parts 21c and the pair of circular arc parts 21b adjacent to this straight line part 21c. Furthermore, the frame cutout 23a is formed in such a manner as to cut out the outer edge of the annular frame 21 with an acute angle. In addition, this frame cutout 23b is formed in such a manner as to cut out the outer edge of the annular frame 21 with a right angle.

The pair of frame cutouts 23a and 23b are used for indicating the orientation of the workpiece 11 integrated with the annular frame 21 through a tape. For example, the workpiece 11 is integrated with the annular frame 21 in such a manner that the above-described first direction is perpendicular to the straight line part 21c disposed between the pair of frame cutouts 23a and 23b and the above-described second direction is parallel to the straight line part 21c disposed between the pair of frame cutouts 23a and 23b. In this case, position adjustment of the workpiece 11 when treatment is executed for the workpiece 11 becomes easy.

Referring again to FIG. 2, remaining constituent elements of the tape sticking apparatus 2 will be described. In FIG. 2, the workpiece 11 housed in the cassette 8a, the work unit (workpiece 11 and the annular frame 21 integrated through a tape) housed in the cassette 8b, and the annular frames 21 housed in the cassette 8c are illustrated by dashed lines.

An opening 4a extending along the Y1-axis direction is formed in a region in the upper surface of the base 4 located on the rear side of the three cassette placement pedestals 6a, 6b, and 6c. In this opening 4a, a first conveying unit 10a that conveys the annular frame 21 and the work unit and a second conveying unit 10b that conveys the workpiece 11 are disposed.

The first conveying unit 10a and the second conveying unit 10b have moving support parts 12a and 12b, respectively, that can move along the Y1-axis direction. These moving support parts 12a and 12b each have a piston rod that can move along the Z1-axis direction and each incorporate an actuator (not illustrated) such as an air cylinder that can rotate with a straight line along the Z1-axis direction being the rotation axis.

Furthermore, an opening through which this piston rod passes is formed in the upper surface of each of the moving support parts 12a and 12b. In addition, lower end parts of conveying arms 14a and 14b are coupled to upper end parts of these piston rods. These conveying arms 14a and 14b are robot arms having multiple joints that can each rotate with a straight line along the Z1-axis direction being the rotation axis.

Upper end parts of these conveying arms 14a and 14b each incorporate a motor that rotates a spindle that can rotate with a straight line along a direction perpendicular to the Z1-axis direction being the rotation axis. These spindles pass through openings formed in side surfaces of the upper end parts of the conveying arms 14a and 14b and are coupled to base end parts of robot hands 16a and 16b.

In one surface of each of these robot hands 16a and 16b, for example, multiple suction holes (not illustrated) are formed. Furthermore, these suction holes are connected to a suction source (not illustrated) such as a vacuum pump through a flow path made inside the robot hand 16a or 16b, a valve that controls the flow of a gas, and so forth.

Moreover, by opening the valve in a state in which this suction source operates, a negative pressure is generated in a space near the one surface of the robot hand 16a or 16b. Due to this, the one surface of the robot hand 16a of the first conveying unit 10a functions as a holding surface that suction-holds the annular frame 21. Similarly, the one surface of the robot hand 16b of the second conveying unit 10b functions as a holding surface that suction-holds the workpiece 11.

Moreover, in the first conveying unit 10a, it is also possible to invert the annular frame 21 upside down by rotating the spindle incorporated in the upper end part of the conveying arm 14a in a state in which the annular frame 21 is suction-held by the holding surface of the robot hand 16a.

Similarly, in the second conveying unit 10b, it is also possible to invert the workpiece 11 upside down by rotating the spindle incorporated in the upper end part of the conveying arm 14b in a state in which the workpiece 11 is suction-held by the holding surface of the robot hand 16b.

An X1-axis direction movement mechanism 18 that moves a support pedestal 20 along the X1-axis direction is disposed in a region in the upper surface of the base 4 located on the rear side of the opening 4a. This X1-axis direction movement mechanism 18 has a pair of guide rails 18a that each extend along the X1-axis direction.

Furthermore, the lower surface side of the support pedestal 20 is slidably coupled to the upper surface side of the pair of guide rails 18a. In addition, a screw shaft 18b extending along the X1-axis direction is disposed between the pair of guide rails 18a.

A motor 18c for rotating the screw shaft 18b is coupled to a front end part of this screw shaft 18b. In addition, a nut part (not illustrated) that houses a large number of balls that roll on the surface of the screw shaft 18b that rotates is disposed on the surface in which a spiral groove is formed in the screw shaft 18b, so that a ball screw is configured.

That is, when the screw shaft 18b rotates, the large number of balls circulate in the nut part, and the nut part moves along the X1-axis direction. Furthermore, this nut part is fixed to the lower surface of the support pedestal 20. Thus, when the screw shaft 18b is rotated by the motor 18c, the support pedestal 20 moves along the X1-axis direction together with the nut part.

This can dispose the support pedestal 20 in either a carrying-out/in zone located above the front side of the pair of guide rails 18a or a tape sticking zone located above the rear side thereof. The carrying-out/in zone is a zone of the support pedestal 20 in which carrying-in of the workpiece 11 and the annular frame 21 to the support pedestal 20 and carrying-out of the work unit from the support pedestal 20 can be executed.

Furthermore, the tape sticking zone is a zone of the support pedestal 20 in which formation of the work unit (integration of the workpiece 11 and the annular frame 21 through a tape) can be executed. In addition, in FIG. 2, the support pedestal 20 disposed in the tape sticking zone is illustrated.

Figure 4:
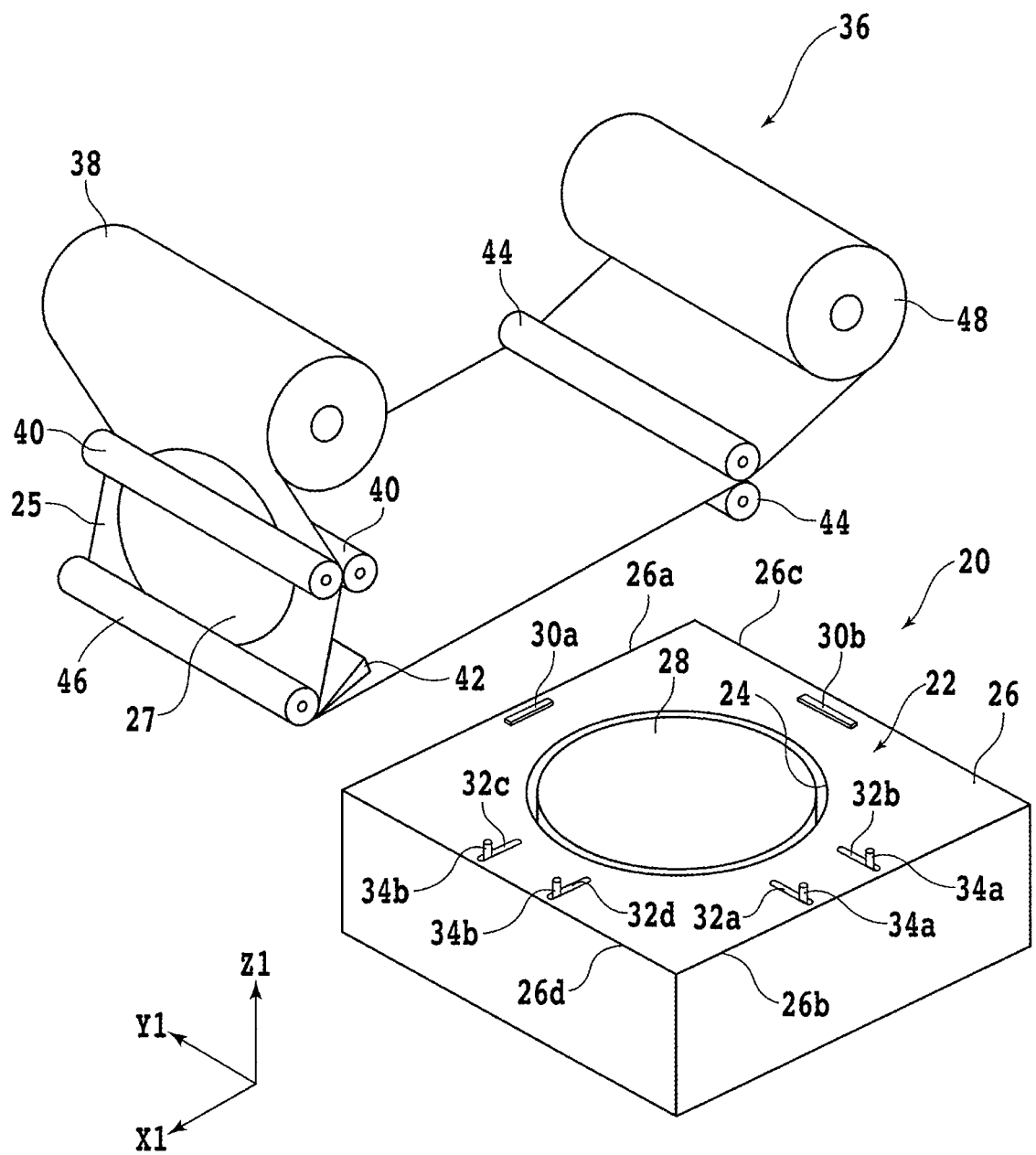
FIG. 4 is a partially enlarged perspective view schematically illustrating a support pedestal and a tape sticking unit.

The formation of the work unit is executed by a tape sticking unit 36 disposed above the tape sticking zone of the support pedestal 20. FIG. 4 is a partially enlarged perspective view schematically illustrating the support pedestal 20 and the tape sticking unit 36. The support pedestal 20 has a rectangular parallelepiped-shaped frame support pedestal 22 that supports the annular frame 21.

A circular opening 24 is formed at the center of this frame support pedestal 22, and the frame support pedestal 22 has a square-shaped upper surface 26 including a pair of sides 26a and 26b extending along the X1-axis direction and a pair of sides 26c and 26d extending along the Y1-axis direction. Furthermore, inside this opening 24, a spindle (not illustrated) extending along the Z1-axis direction and a motor (not illustrated) that rotates this spindle with a straight line along the Z1-axis direction being the rotation axis are disposed.

A lower part of a circular columnar workpiece support pedestal 28 that holds the workpiece 11 is coupled to an upper part of this spindle. In addition, when the motor incorporated in the frame support pedestal 22 operates, the workpiece support pedestal 28 rotates together with the spindle with the rotation axis being a straight line that passes through the center of the upper surface of the workpiece support pedestal 28 and is along the Z1-axis direction.

Moreover, a raising-lowering mechanism (not illustrated) that moves (raises and lowers) the workpiece support pedestal 28 along the Z1-axis direction is disposed inside this opening 24. For example, this raising-lowering mechanism adjusts the height of the workpiece support pedestal 28 to align the height between the upper surface of the annular frame 21 supported by the frame support pedestal 22 and the upper surface of the workpiece 11 supported by the workpiece support pedestal 28.

Furthermore, a pair of fixed protrusions 30a and 30b whose height is shorter than the thickness of the annular frame 21 are disposed on the upper surface 26 of the frame support pedestal 22. This fixed protrusion 30a is disposed on the side of the side 26a of the upper surface 26 of the frame support pedestal 22 as viewed from the upper surface of the workpiece support pedestal 28 and extends along the X1-axis direction. Similarly, the fixed protrusion 30b is disposed on the side of the side 26c of the upper surface 26 of the frame support pedestal 22 as viewed from the upper surface of the workpiece support pedestal 28 and extends along the Y1-axis direction.

Moreover, a pair of openings 32a and 32b extending along the Y1-axis direction and a pair of openings 32c and 32d extending along the X1-axis direction are formed in the upper surface 26 of the frame support pedestal 22. These pair of openings 32a and 32b are disposed on the side of the side 26b of the upper surface 26 of the frame support pedestal 22 as viewed from the upper surface of the workpiece support pedestal 28. Similarly, the pair of openings 32c and 32d are disposed on the side of the side 26d of the upper surface 26 of the frame support pedestal 22 as viewed from the upper surface of the workpiece support pedestal 28.

Furthermore, a movable protrusion 34a that can move along the Y1-axis direction is made to pass through each of the pair of openings 32a and 32b. Similarly, a movable protrusion 34b that can move along the X1-axis direction is made to pass through each of the pair of openings 32c and 32d. In addition, two actuators that move the movable protrusions 34a and 34b are incorporated in the frame support pedestal 22.

Specifically, the frame support pedestal 22 incorporates a first actuator (not illustrated) such as an air cylinder having a first piston rod that can move along the Y1-axis direction. Furthermore, lower parts of the movable protrusions 34a are coupled to a tip part of this first piston rod through a coupling component (not illustrated).

Similarly, the frame support pedestal 22 incorporates a second actuator (not illustrated) such as an air cylinder having a second piston rod that can move along the X1-axis direction. Furthermore, lower parts of the movable protrusions 34b are coupled to a tip part of this second piston rod through a coupling component (not illustrated).

The tape sticking unit 36 disposed above the tape sticking zone of the support pedestal 20 has a supply roller 38. Multiple circular tapes (first tapes) 27 in the state of sticking to a release base 25 are taken up by this supply roller 38.

The diameter of the tape 27 is longer than the inner diameter of the annular frame 21 (diameter of the opening 21a) and is shorter than the sides of the square that overlaps with the straight line parts 21c at the outer edge of the annular frame 21 (see FIG. 3B).

Furthermore, each of the multiple tapes 27 has, for example, a film-shaped tape base having flexibility and an adhesive layer (glue layer) disposed on one surface of this tape base (surface on the side of the release base 25). In addition, each of the tape base and the adhesive layer is composed of a material through which visible light is transmitted.

Specifically, the tape base is composed of polyolefin (PO), polyethylene terephthalate (PET), polyvinyl chloride (PVC), polystyrene (PS), or the like. Furthermore, the adhesive layer is composed of an ultraviolet-curable silicone rubber, an acrylic-based material, an epoxy-based material, or the like.

Moreover, in each of the multiple tapes 27, anisotropy exists in the stretch rate when a predetermined force is applied to the tape 27. For example, in each of the multiple tapes 27, the stretch rate becomes the lowest when a predetermined force is applied to the tape 27 along the tensile direction (MD) of the tape 27 in manufacturing of the tape 27.

Furthermore, the multiple tapes 27 are pulled out by inducing rollers 40 toward an obliquely lower side together with the release base 25. Here, each of the multiple tapes 27 sticks to the release base 25 in such a manner that the direction in which the tapes 27 are pulled out by the inducing rollers 40 is parallel to the tensile direction (MD).

In addition, the direction in which the multiple tapes 27 are pulled out by the inducing rollers 40 is the direction parallel to the X1-axis direction. Thus, in each of the multiple tapes 27, the stretch rate becomes the lowest when a predetermined force is applied to the tape 27 along the X1-axis direction.

Moreover, each of the multiple tapes 27 pulled out by the inducing rollers 40 is separated from the release base 25 by a separating component 42 that gets line-contact with the release base 25. Specifically, the release base 25 is pulled by inducing rollers 44 disposed on the rear side of the separating component 42.

Thus, the traveling direction of the release base 25 greatly changes between before and after the contact with the separating component 42. On the other hand, each of the multiple tapes 27 is not pulled by the inducing rollers 44. As a result, each of the multiple tapes 27 separates from the release base 25 with the contact between the separating component 42 and the release base 25 being the trigger.

Furthermore, a pressing roller 46 used in sticking the tape 27 separated from the release base 25 to the workpiece 11 and the annular frame 21 is disposed at a position opposed to the separating component 42 with the interposition of the release base 25.

In addition, the release base 25 pulled by the inducing rollers 44 is taken up and recovered by a recovering roller 48 disposed above the inducing rollers 44. Moreover, the tape sticking unit 36 is coupled to a raising-lowering mechanism (not illustrated).

For example, this raising-lowering mechanism adjusts the height of the tape sticking unit 36 to position the pressing roller 46 to a height at which the pressing roller 46 can get contact with the annular frame 21 and/or the workpiece 11 placed on the support pedestal 20 positioned in the tape sticking zone. This can press the tape 27 against the annular frame 21 and/or the workpiece 11 by the pressing roller 46.

In the tape sticking apparatus 2 illustrated in FIG. 2, the work unit forming step (S1) is executed in the following order, for example. Specifically, first, the X1-axis direction movement mechanism 18 is operated to dispose the support pedestal 20 in the carrying-out/in zone. Subsequently, the workpiece 11 and the annular frame 21 are carried in to the support pedestal 20.

Figure 5:
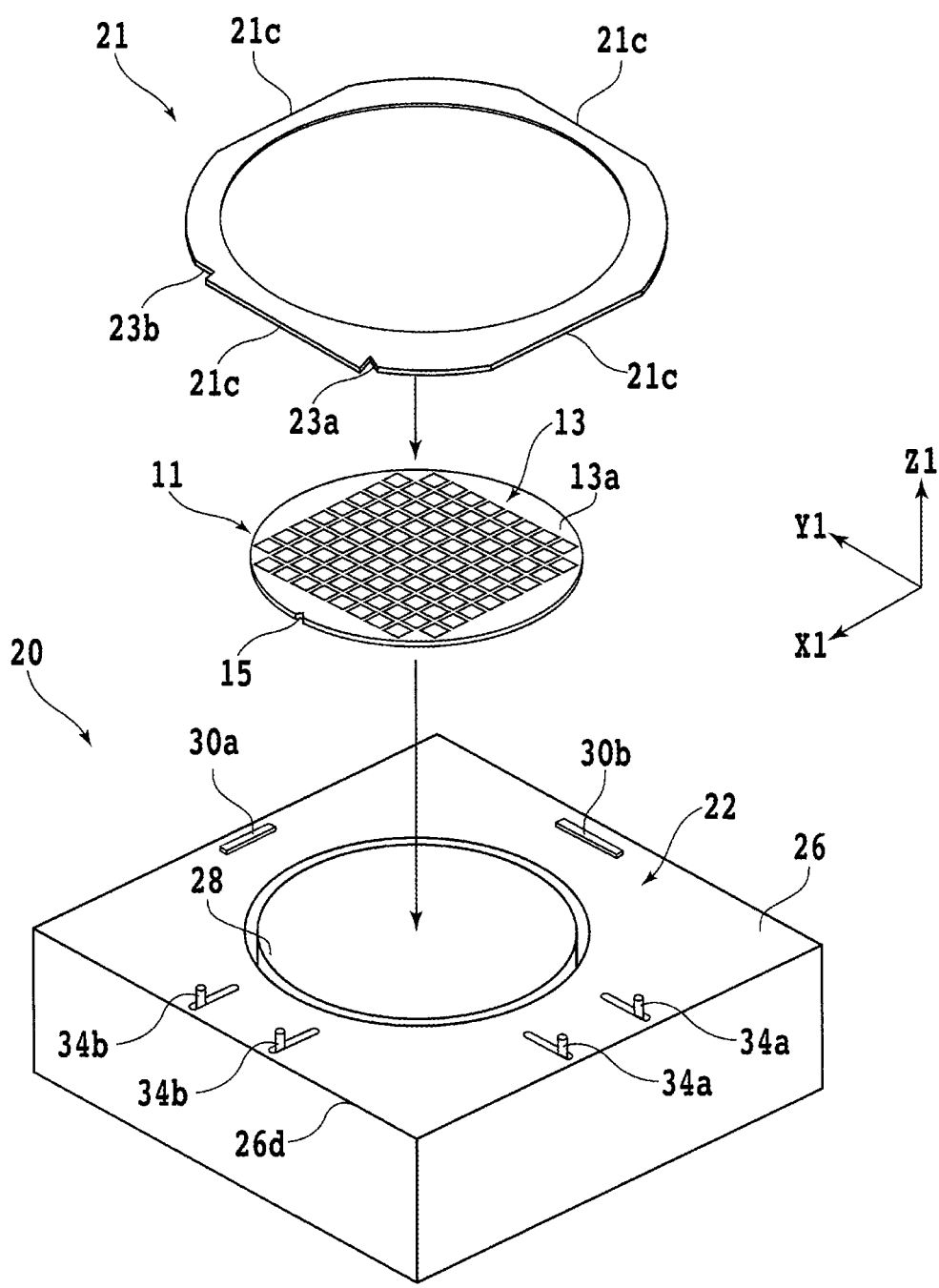
FIG. 5 is a perspective view schematically illustrating the state in which the workpiece and the annular frame are carried in to the support pedestal.

FIG. 5 is a perspective view schematically illustrating the state in which the workpiece 11 and the annular frame 21 are carried in to the support pedestal 20. Specifically, the second conveying unit 10b is operated to carry out the workpiece 11 housed in the cassette 8a from the cassette 8a and carry in the workpiece 11 onto the upper surface of the workpiece support pedestal 28 of the support pedestal 20.

At this time, the second conveying unit 10b carries in the workpiece 11 onto the upper surface of the workpiece support pedestal 28 in such a manner that the front surface of the workpiece 11 (front surface 13a of the substrate 13) is oriented upward and the notch 15 is disposed on the side of the side 26d of the upper surface 26 of the frame support pedestal 22 as viewed from the upper surface of the workpiece support pedestal 28.

That is, the workpiece 11 is carried in onto the upper surface of the workpiece support pedestal 28 in such a manner that each of the multiple planned dividing lines 17a becomes parallel to the X1-axis direction and each of the multiple planned dividing lines 17b becomes parallel to the Y1-axis direction.

Furthermore, the first conveying unit 10a is operated to carry out the annular frame 21 housed in the cassette 8c from the cassette 8c and carry in the annular frame 21 onto the upper surface 26 of the frame support pedestal 22 of the support pedestal 20.

At this time, the first conveying unit 10a carries in the annular frame 21 onto the upper surface 26 of the frame support pedestal 22 in such a manner that the straight line part 21c disposed between the pair of frame cutouts 23a and 23b is disposed on the side of the side 26d of the upper surface 26 of the frame support pedestal 22 as viewed from the upper surface of the workpiece support pedestal 28.

That is, the annular frame 21 is carried in onto the upper surface of the frame support pedestal 22 in such a manner that the pair of straight line parts 21c including this straight line part 21c become parallel to the Y1-axis direction and the remaining pair of straight line parts 21c become parallel to the X1-axis direction.

Prior to the carrying-in of the annular frame 21 to the frame support pedestal 22, the movable protrusions 34a and the movable protrusions 34b are disposed at the positions remotest from the workpiece support pedestal 28. Furthermore, this annular frame 21 is carried in to a region on the inside relative to the fixed protrusion 30a and the fixed protrusion 30b and the movable protrusions 34a and the movable protrusions 34b.

Figure 6:
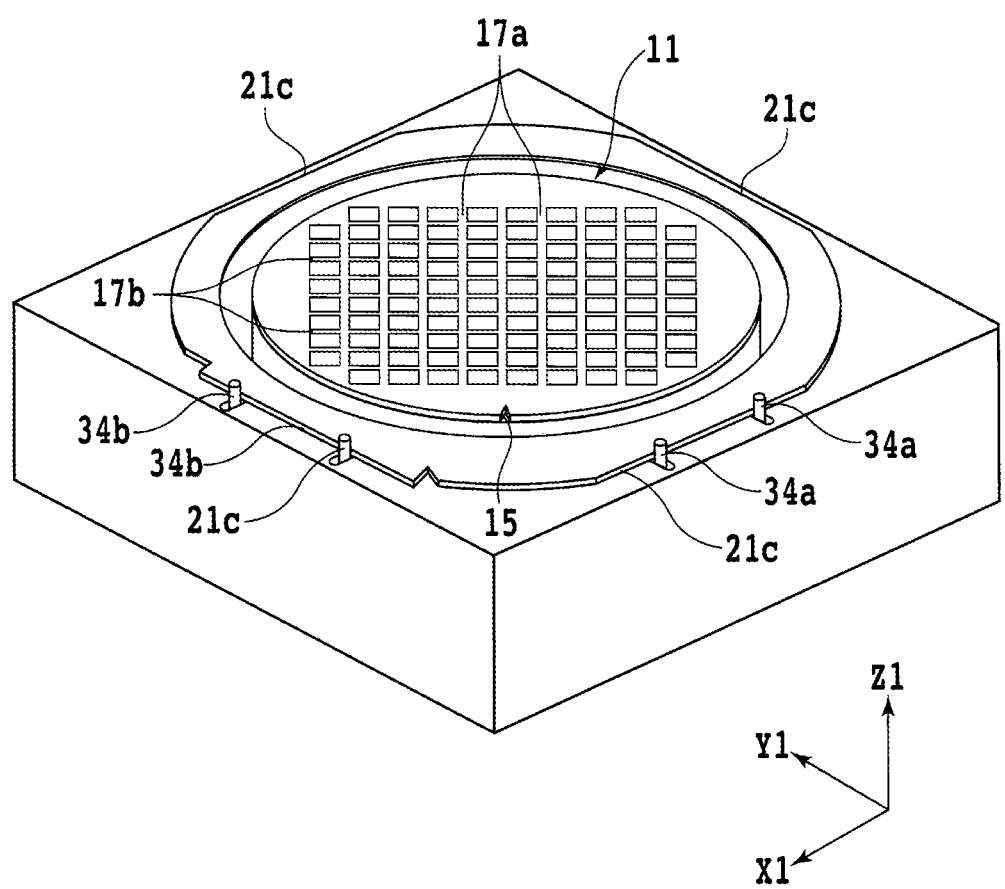
FIG. 6 is a perspective view schematically illustrating the workpiece and the annular frame whose positions have been adjusted.

Subsequently, the workpiece 11 is rotated, and the annular frame 21 is moved in the horizontal direction to thereby adjust the positions of both. FIG. 6 is a perspective view schematically illustrating the workpiece 11 and the annular frame 21 whose positions have been adjusted.

Specifically, the workpiece 11 is rotated by a predetermined angle (for example, 45°). This causes each of the multiple planned dividing lines 17a and 17b of the workpiece 11 to become non-parallel to the X1-axis direction. That is, each of the multiple planned dividing lines 17a and 17b becomes non-parallel to the direction in which the stretch rate becomes the lowest when a predetermined force is applied to the above-described tape 27.

Furthermore, the movable protrusions 34a are moved along the Y1-axis direction to be brought closer to the workpiece support pedestal 28. This causes the movable protrusions 34a to get contact with one of the pair of straight line parts 21c parallel to the X1-axis direction. Then, the movable protrusions 34a are moved along the Y1-axis direction until the other of the pair of straight line parts 21c parallel to the X1-axis direction gets contact with the fixed protrusion 30a.

Similarly, the movable protrusions 34b are moved along the X1-axis direction to be brought closer to the workpiece support pedestal 28. This causes the movable protrusions 34b to get contact with one of the pair of straight line parts 21c parallel to the Y1-axis direction. Then, the movable protrusions 34b are moved along the X1-axis direction until the other of the pair of straight line parts 21c parallel to the Y1-axis direction gets contact with the fixed protrusion 30b.

Subsequently, according to need, the raising-lowering mechanism disposed inside the opening 24 is operated to raise and lower the workpiece support pedestal 28. That is, when the height is greatly different between the upper surface of the annular frame 21 held by the frame support pedestal 22 and the upper surface (front surface) of the workpiece 11 (front surface 13a of the substrate 13) supported by the workpiece support pedestal 28, the height of the workpiece support pedestal 28 is adjusted to align the heights of both.

Figure 7:
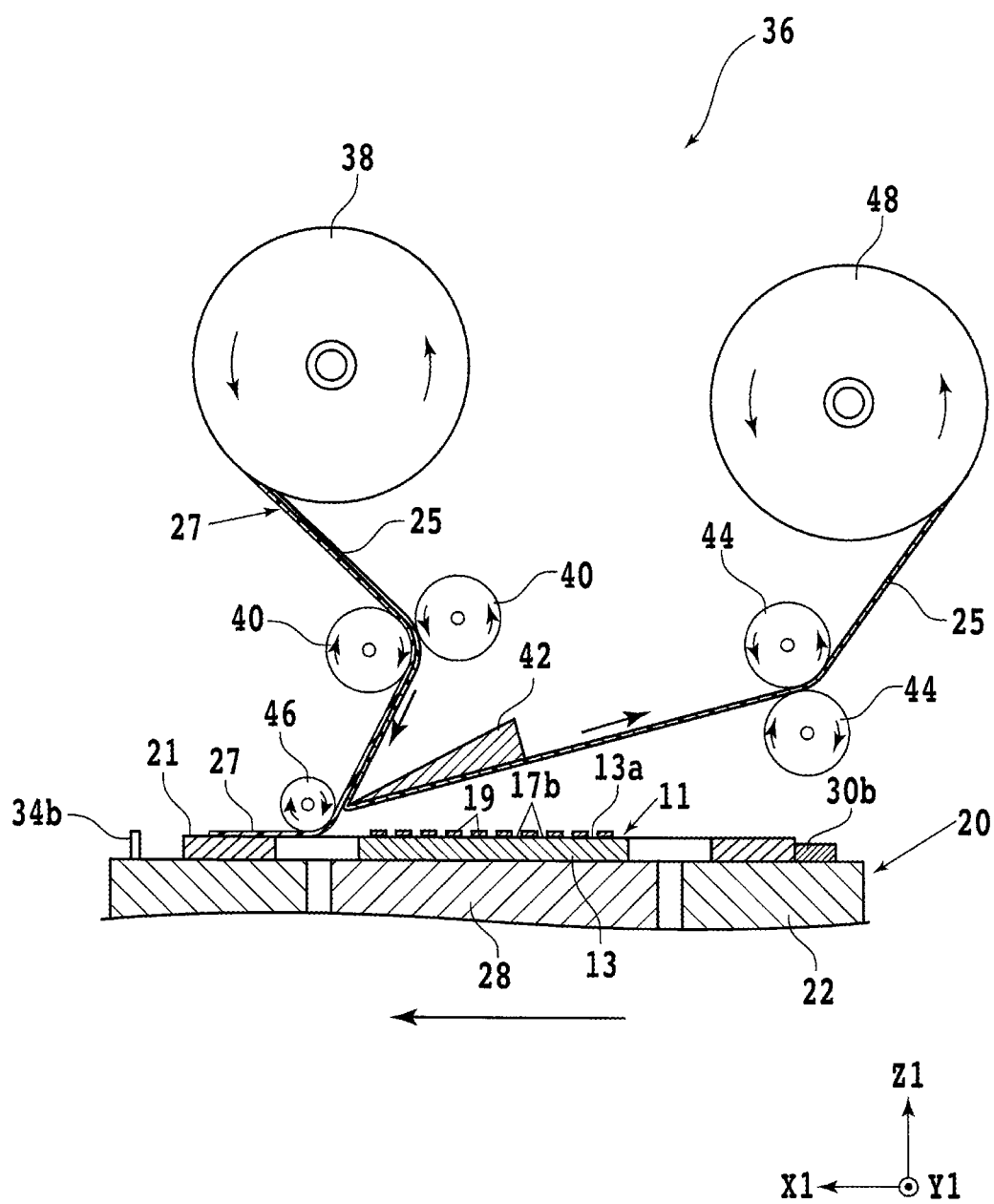
FIG. 7 is a partially sectional side view schematically illustrating the state in which a tape is stuck to the workpiece and the annular frame.

Next, the tape 27 is stuck to the workpiece 11 and the annular frame 21. FIG. 7 is a partially sectional side view schematically illustrating the state in which the tape 27 is stuck to the workpiece 11 and the annular frame 21. Specifically, first, the X1-axis direction movement mechanism 18 is operated to dispose the support pedestal 20 that supports the workpiece 11 and the annular frame 21 in the tape sticking zone. At this time, the movable protrusions 34b are positioned substantially directly below the pressing roller 46 of the tape sticking unit 36.

Subsequently, the movable protrusions 34b are moved to the positions remotest from the workpiece support pedestal 28. Next, the tape sticking unit 36 is lowered to a height at which the pressing roller 46 can get contact with the workpiece 11 and the annular frame 21. Subsequently, the inducing rollers 40 and 44, the pressing roller 46, and the recovering roller 48 (pressing roller 46 and so forth) are rotated to cause the tape 27 to separate from the release base 25 and face the upper surface of the annular frame 21.

Next, the support pedestal 20 is moved forward while the rotation of the pressing roller 46 and so forth is continued. Thereby, the tape 27 is pressed downward by the pressing roller 46. As a result, the tape 27 is gradually stuck to the upper surface of the annular frame 21 and the upper surface (front surface) of the workpiece 11 (front surface 13a of the substrate 13).

Here, the shape of the front surface of the workpiece 11 is a recessed/protruding shape including protruding parts (multiple regions 19 in which devices are formed) and recessed parts (regions corresponding to the multiple planned dividing lines 17a and 17b). Furthermore, for sticking the tape 27 to the whole of the front surface of the workpiece 11, the region stuck to the vicinity of the boundary between each of the multiple planned dividing lines 17a and 17b and the region 19 in which the device is formed in the tape 27 needs to stretch.

Regarding this point, the tape 27 is disposed in such a manner that the direction in which the stretch rate becomes the lowest when a predetermined force is applied to the tape 27 is non-parallel to each of the multiple planned dividing lines 17a and 17b as described above. This can reduce the ratio of the region to which the tape 27 does not stick in the front surface of the workpiece 11 in the vicinity of the boundary between each of the multiple planned dividing lines 17a and 17b and the region 19 in which the device is formed.

Moreover, it is preferable that the angle formed by a straight line along the direction in which the stretch rate of the tape 27 becomes the lowest (straight line along the above-described third direction) and a straight line along each of the multiple planned dividing lines 17a (straight line along the above-described first direction) be 45°. That is, it is preferable that the angle formed by the straight line along the above-described third direction and a straight line along each of the multiple planned dividing lines 17b (straight line along the above-described second direction) be 45°.

In this case, the inclination of the direction in which the stretch rate of the tape 27 becomes the lowest with respect to each of the multiple planned dividing lines 17a and 17b becomes equal. Thus, it is possible to equalize the ratio of the region to which the tape 27 does not stick in the front surface of the workpiece 11 in the vicinity of the boundary between each of the multiple planned dividing lines 17a and 17b and the region 19 in which the device is formed.

Figure 8:
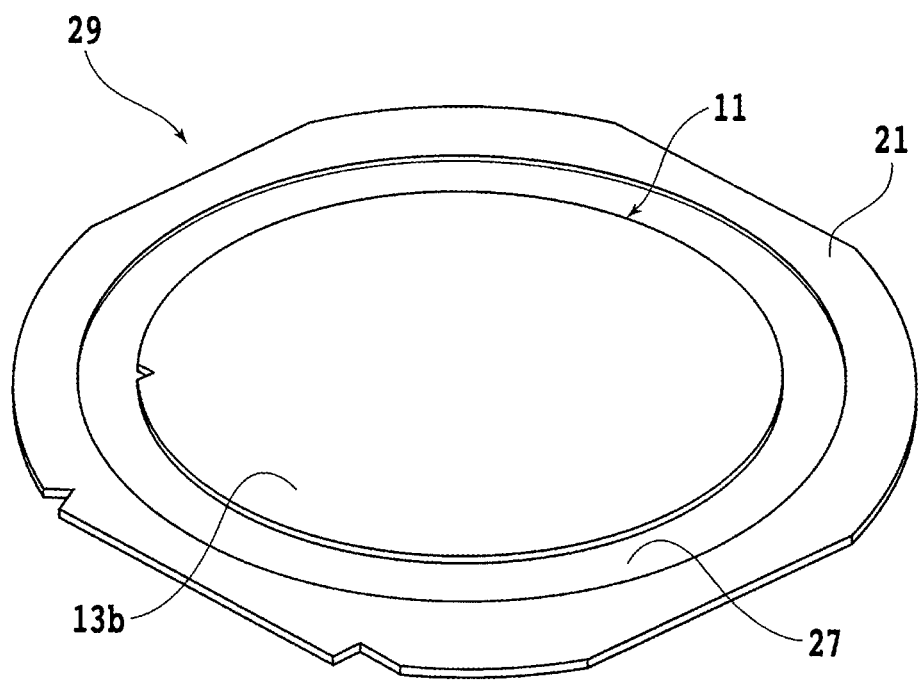
FIG. 8 is a perspective view schematically illustrating one example of a work unit.

Through the above, the tape 27 is stuck to the workpiece 11 and the annular frame 21. As a result, the work unit (first work unit) in which the workpiece 11 and the annular frame 21 are integrated through the tape 27 is formed. FIG. 8 is a perspective view schematically illustrating this work unit 29. In FIG. 8, the side of the back surface of the workpiece 11 (back surface 13b of the substrate 13) is illustrated.

Subsequently, this work unit 29 is carried in to the cassette 8b. Specifically, first, the X1-axis direction movement mechanism 18 is operated to dispose the support pedestal 20 in the carrying-out/in zone. Then, the first conveying unit 10a is operated to carry out the work unit 29 supported by the support pedestal 20 from the support pedestal 20 and carry in the work unit 29 to the cassette 8b.

In the dividing method of a workpiece illustrated in FIG. 1, after the work unit forming step (S1), the side of the tape 27 of the work unit 29 is held, and the back surface of the workpiece (back surface 13b of the substrate 13) is exposed (holding step: S2). Then, after this holding step (S2), the workpiece 11 is divided by a cutting blade from the back surface side of the workpiece 11 along each of the multiple planned dividing lines 17a and 17b (dividing step: S3).

Figure 9:
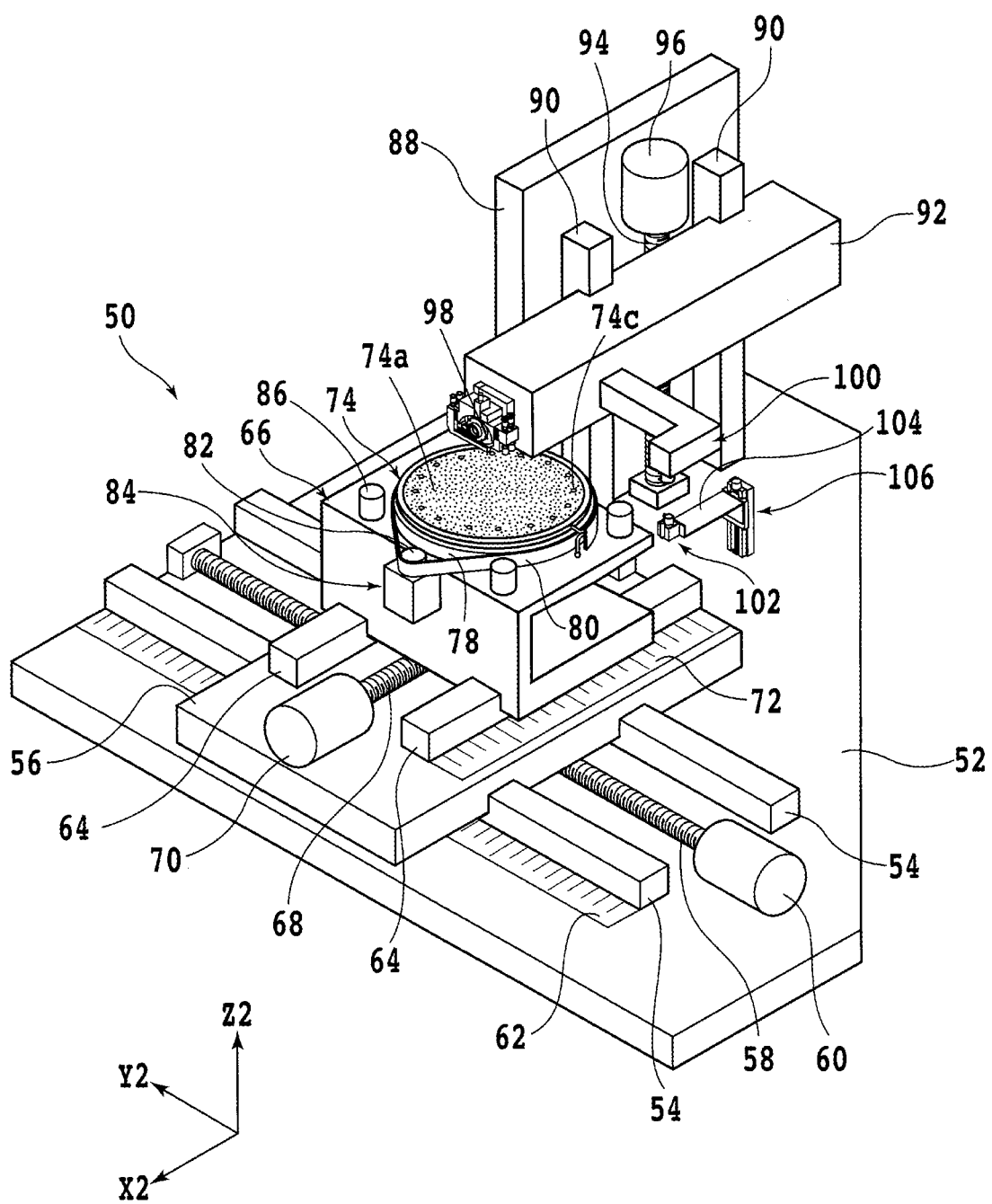
FIG. 9 is a perspective view schematically illustrating one example of a cutting apparatus used for executing a holding step and a dividing step.

FIG. 9 is a perspective view schematically illustrating one example of a cutting apparatus used for executing the holding step (S2) and the dividing step (S3). An X2-axis direction (front-rear direction) and a Y2-axis direction (left-right direction) illustrated in FIG. 9 are directions perpendicular to each other on a horizontal plane. Furthermore, a Z2-axis direction (upward-downward direction) is the direction perpendicular to the X2-axis direction and the Y2-axis direction (vertical direction).

A cutting apparatus 50 illustrated in FIG. 9 has a base 52 that supports the respective constituent elements. A pair of guide rails 54 that each extend along the Y2-axis direction are disposed on the front side of the upper surface of this base 52. Furthermore, a rectangular parallelepiped-shaped moving table 56 extending along the X2-axis direction is slidably coupled to the upper surface side of the pair of guide rails 54.

Moreover, a screw shaft 58 extending along the Y2-axis direction is disposed between the pair of guide rails 54. A motor 60 for rotating the screw shaft 58 is coupled to one end part of this screw shaft 58. In addition, a nut part (not illustrated) that houses a large number of balls that roll on the surface of the screw shaft 58 that rotates is disposed on the surface in which a spiral groove is formed in the screw shaft 58, so that a ball screw is configured.

That is, when the screw shaft 58 rotates, the large number of balls circulate in the nut part, and the nut part moves along the Y2-axis direction. Furthermore, this nut part is fixed to the lower surface of the moving table 56. Thus, when the screw shaft 58 is rotated by the motor 60, the moving table 56 moves along the Y2-axis direction together with the nut part.

Moreover, a Y2-axis scale 62 is disposed in a region that adjoins the guide rail 54 on the upper surface of the base 52. This Y2-axis scale 62 is used when the position of the moving table 56 in the Y2-axis direction is measured.

A pair of guide rails 64 that each extend along the X2-axis direction are disposed on the upper surface of the moving table 56. In addition, a table base 66 is slidably coupled to the upper surface side of the pair of guide rails 64. The detailed structure of the table base 66 will be described later.

Furthermore, a screw shaft 68 extending along the X2-axis direction is disposed between the pair of guide rails 64. A motor 70 for rotating the screw shaft 68 is coupled to a front end part (one end part) of this screw shaft 68. In addition, a nut part (not illustrated) that houses a large number of balls that roll on the surface of the screw shaft 68 that rotates is disposed on the surface in which a spiral groove is formed in the screw shaft 68, so that a ball screw is configured.

That is, when the screw shaft 68 rotates, the large number of balls circulate in the nut part, and the nut part moves along the X2-axis direction. Furthermore, this nut part is fixed to the lower surface of the table base 66. Thus, when the screw shaft 68 is rotated by the motor 70, the table base 66 moves along the X2-axis direction together with the nut part.

Moreover, an X2-axis scale 72 is disposed in a region that adjoins the guide rail 64 on the upper surface of the moving table 56. This X2-axis scale 72 is used when the position of the table base 66 in the X2-axis direction is measured.

Figure 10:
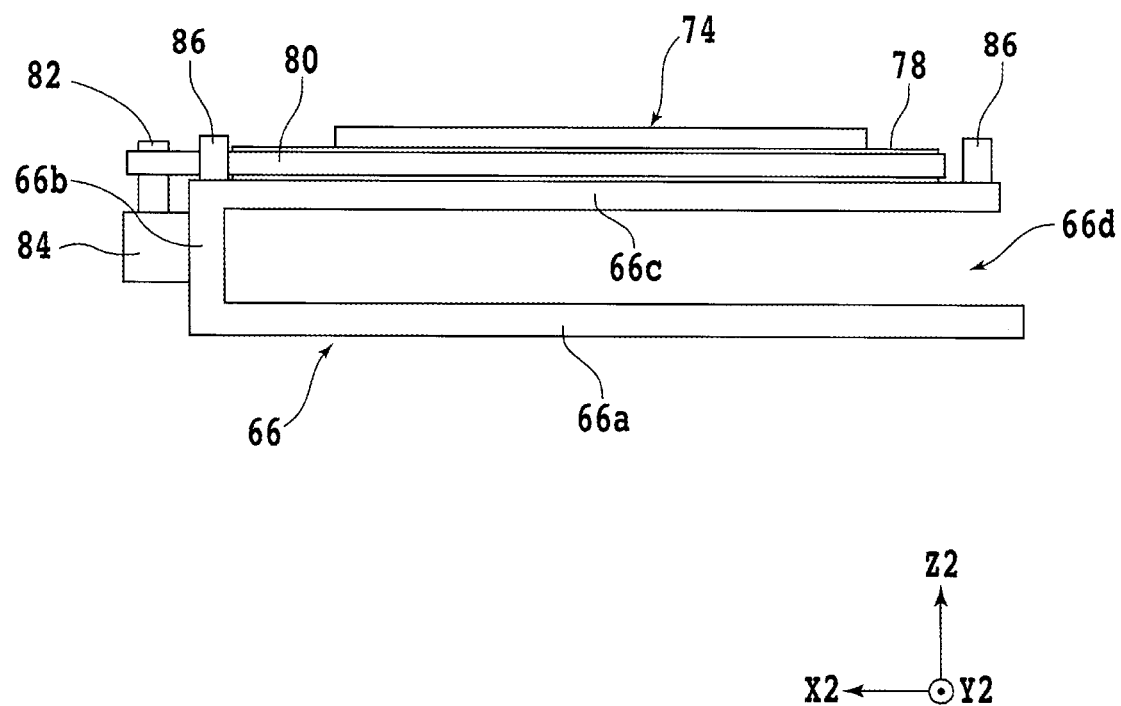
FIG. 10 is a side view schematically illustrating a table base, a holding table, and a motor.

A holding table 74 is disposed on the upper surface of the table base 66. Furthermore, a motor 84 for rotating the holding table 74 with the rotation axis being a straight line that passes through the center of the holding table 74 and is along the Z2-axis direction is disposed on a side surface of the table base 66. FIG. 10 is a side view schematically illustrating the table base 66, the holding table 74, and the motor 84.

The table base 66 has a bottom plate part 66a with a rectangular parallelepiped shape. The lower surface side of this bottom plate part 66a (lower surface side of the table base 66) is coupled to the pair of guide rails 64. In addition, a rectangular parallelepiped-shaped erected part 66b extending upward is disposed at an upper part of the front end of the bottom plate part 66a.

Moreover, a rectangular parallelepiped-shaped top plate part 66c extending rearward is disposed at a rear part of the upper end of this erected part 66b. A circular columnar through-hole (not illustrated) that penetrates the top plate part 66c in the upward-downward direction is formed at the center of this top plate part 66c. In addition, in the table base 66, an open space 66d exists between the upper surface of the bottom plate part 66a and the lower surface of the top plate part 66c.

Figure 11:
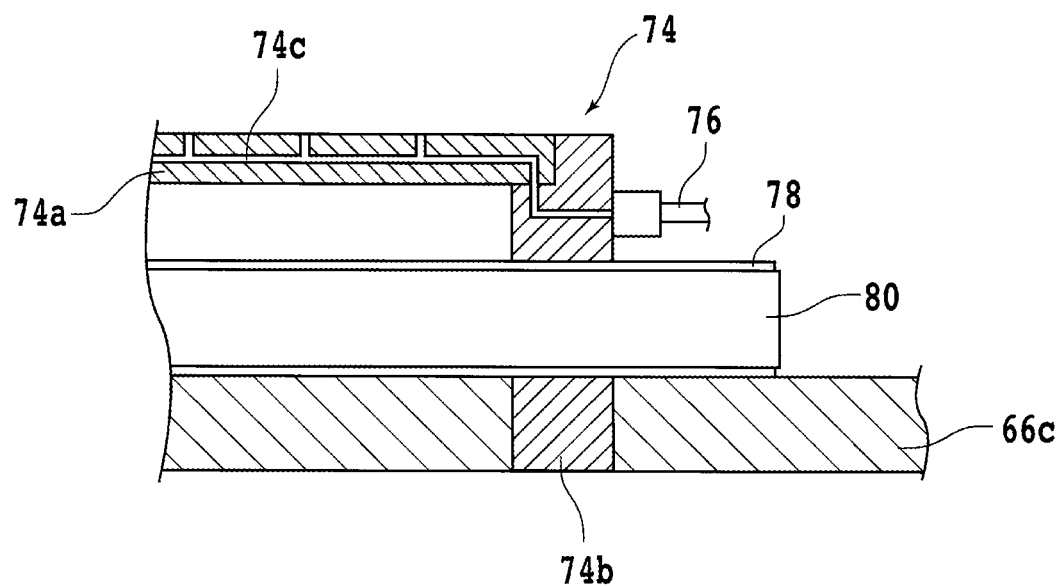
FIG. 11 is a partially sectional side view illustrating the table base and the holding table in an enlarged manner.

Furthermore, on the upper surface of the table base 66 (upper surface of the top plate part 66c), the holding table 74 is disposed to cover the through-hole formed in the top plate part 66c. This holding table 74 is supported by the table base 66 in such a manner as to be rotatable with the rotation axis being a straight line that passes through the center of the holding table 74 and is along the Z2-axis direction. FIG. 11 is a partially sectional side view illustrating part of the table base 66 and the holding table 74 in an enlarged manner.

The holding table 74 has a circular disc-shaped holding component 74a located above the through-hole formed in the top plate part 66c. This holding component 74a is composed of a material through which visible light is transmitted, such as soda glass, borosilicate glass, or quartz glass. Moreover, a circular cylindrical fitted part 74b extending downward from the holding component 74a is disposed at the periphery of the holding component 74a.

Furthermore, a suction path 74c is formed inside the holding component 74a and the fitted part 74b. This suction path 74c communicates with a suction source (not illustrated) such as a vacuum pump through a pipe 76 connected to the outer side surface of the fitted part 74b, and so forth. Moreover, a circular annular fitting hole is formed in the top plate part 66c, and a lower part of the fitted part 74b is slidably inserted in this fitting hole.

Furthermore, a circular cylindrical driven pulley 78 is disposed on the outer side surface of the fitted part 74b. A belt 80 is put around this driven pulley 78. Moreover, as illustrated in FIG. 10, this belt 80 is put also around an upper part of a driving pulley 82 extending along the Z2-axis direction. In addition, a lower part of this driving pulley 82 is coupled to the motor 84 disposed on the front surface of the erected part 66b.

Moreover, when this motor 84 operates, the driving pulley 82 rotates with a straight line along the Z2-axis direction being the rotation axis, and the force that rotates the driving pulley 82 is transmitted also to the driven pulley 78 through the belt 80. This causes the holding table 74 to rotate together with the driven pulley 78 with the rotation axis being a straight line that passes through the center of the holding table 74 and is along the Z2-axis direction.

In addition, a circular columnar frame support part 86 is disposed at each of four corners of the upper surface of the table base 66 (upper surface of the top plate part 66c). These frame support parts 86 support the annular frame 21 with the interposition of the tape 27 when the work unit 29 is placed over the holding table 74.

The upper surfaces of these frame support parts 86 are set lower than the upper surface of the holding table 74 such that the upper surface of the annular frame 21 is located on the lower side relative to the upper surface of the holding table 74 (upper surface of the holding component 74a) when the work unit 29 is placed over the holding table 74.

Referring again to FIG. 9, remaining constituent elements of the cutting apparatus 50 will be described. A support structure 88 with a rectangular parallelepiped shape is disposed on the rear side of the upper surface of the base 52. A pair of guide rails 90 that each extend along the Z2-axis direction are disposed on a side surface of this support structure 88.

Furthermore, a rectangular parallelepiped-shaped spindle housing 92 extending along the X2-axis direction is slidably coupled to the surface side of the pair of guide rails 90. Moreover, a screw shaft 94 extending along the Z2-axis direction is disposed between the pair of guide rails 90.

A motor 96 for rotating the screw shaft 94 is coupled to an upper end part (one end part) of this screw shaft 94. In addition, a nut part (not illustrated) that houses a large number of balls that roll on the surface of the screw shaft 94 that rotates is disposed on the surface in which a spiral groove is formed in the screw shaft 94, so that a ball screw is configured.

That is, when the screw shaft 94 rotates, the large number of balls circulate in the nut part, and the nut part moves along the Z2-axis direction. Furthermore, this nut part is fixed to the side surface opposed to the support structure 88 in the spindle housing 92. Thus, when the screw shaft 94 is rotated by the motor 96, the spindle housing 92 moves along the Z2-axis direction together with the nut part.

In this spindle housing 92, a spindle (not illustrated) extending along the X2-axis direction and a motor (not illustrated) that rotates this spindle with a straight line along the X2-axis direction being the rotation axis are housed. Furthermore, a tip part (front end part) of this spindle is exposed from an opening formed in the front surface of the spindle housing 92.

Moreover, a circular annular cutting blade 98 is mounted on the tip part of the spindle exposed from the spindle housing 92. Thus, when this spindle rotates, the cutting blade 98 rotates together with the spindle with a straight line along the X2-axis direction being the rotation axis. In addition, an upper imaging unit 100 is disposed on the side surface of the spindle housing 92 on the side remoter from the support structure 88.

This upper imaging unit 100 images a structural object that exists below it by visible light. Furthermore, a lower imaging unit 102 is disposed at a position opposed to the upper imaging unit 100 in the upward-downward direction. This lower imaging unit 102 images a structural object that exists above it by visible light.

Furthermore, the lower imaging unit 102 is coupled to a raising-lowering support mechanism 106 extending along the Z2-axis direction with the interposition of a coupling part 104 extending along the X2-axis direction. This raising-lowering support mechanism 106 is disposed on the upper surface of the base 52 and supports the lower imaging unit 102 in such a manner as to allow the lower imaging unit 102 to raise and lower.

In the cutting apparatus 50, the holding step (S2) and the dividing step (S3) are executed in the following order, for example. Specifically, first, the work unit 29 is placed over the holding table 74 with the back surface of the workpiece 11 (back surface 13b of the substrate 13) oriented upward. That is, the workpiece 11 is placed over the holding component 74a with the interposition of the tape 27, and the annular frame 21 is placed over the frame support parts 86 with the interposition of the tape 27.

Subsequently, the suction source communicating with the suction path 74c formed inside the holding component 74a and the fitted part 74b of the holding table 74 through the pipe 76 is operated. Thereby, the workpiece 11 is suction-held with the interposition of the tape 27 placed on the holding component 74a. Through the above, the holding step (S2) is completed.

Next, the moving table 56 and the table base 66 are moved to cause the through-hole formed in the holding component 74a to be positioned between the upper imaging unit 100 and the lower imaging unit 102. That is, the lower imaging unit 102 is positioned in the open space 66d between the bottom plate part 66a and the top plate part 66c of the table base 66.

Subsequently, the lower imaging unit 102 images the front surface of the workpiece 11 through this through-hole and the holding component 74a and the tape 27 that are transparent. Next, on the basis of an image formed by the imaging by the lower imaging unit 102, the holding table 74 is rotated to cause the multiple planned dividing lines 17a or the multiple planned dividing lines 17b to become parallel to the Y2-axis direction.

Subsequently, the moving table 56 and the table base 66 are moved to cause any of the multiple planned dividing lines 17a and 17b to be positioned in the Y2-axis direction as viewed from the cutting blade 98. Next, the spindle housing 92 is moved to cause the lower end of the cutting blade 98 to be positioned to a position that is higher than the lower surface of the tape 27 and is lower than the upper surface thereof.

Subsequently, the cutting blade 98 is rotated. Next, with the cutting blade 98 kept rotating, the moving table 56 is moved to cause the range from one end to the other end of the workpiece 11 in the Y2-axis direction to pass through the cutting blade 98. Thereby, the workpiece 11 is divided from the back surface side by the cutting blade 98 along any of the multiple planned dividing lines 17a and 17b.

Figure 12:
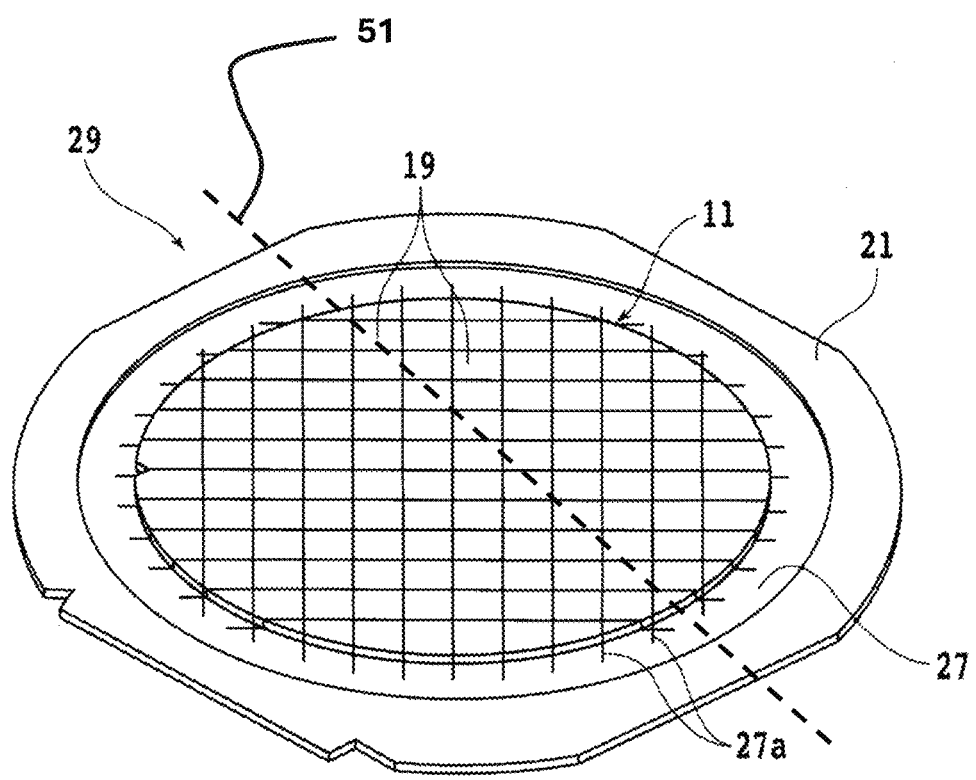
FIG. 12 is a perspective view schematically illustrating one example of the work unit after the dividing step.

By further repeating similar operation, the workpiece 11 is divided from the back surface side by the cutting blade 98 along each of the multiple planned dividing lines 17a and 17b. Through the above, the dividing step (S3) is completed. FIG. 12 is a perspective view schematically illustrating the work unit 29 after the dividing step (S3).

In the dividing step (S3), the cutting blade 98 is caused to cut into the tape 27, and therefore grooves 27a are formed in the tape 27. However, the tape 27 is not divided. Thus, the work unit 29 in which the divided workpiece 11 and the annular frame 21 are integrated through the tape 27 is kept.

As described above, in the dividing method of a workpiece illustrated in FIG. 1, the tape 27 is stuck to the front surface of the workpiece 11 in such a manner that a straight line 51 (FIG. 12) extending along the direction in which the stretch rate becomes the lowest when a predetermined force is applied to the tape 27 is non-parallel to each of the multiple planned dividing lines 17a and 17b. In this case, none of the multiple planned dividing lines 17a and 17b extends along the direction perpendicular to this direction.

This can reduce the ratio of the region to which the tape 27 does not stick in the front surface of the workpiece 11 in the vicinity of the boundary between each of the multiple planned dividing lines 17a and 17b and the region 19 in which the device is formed, and suppress deterioration of the processing quality when the workpiece 11 is divided from the back surface side by the cutting blade 98.

Figure 13:
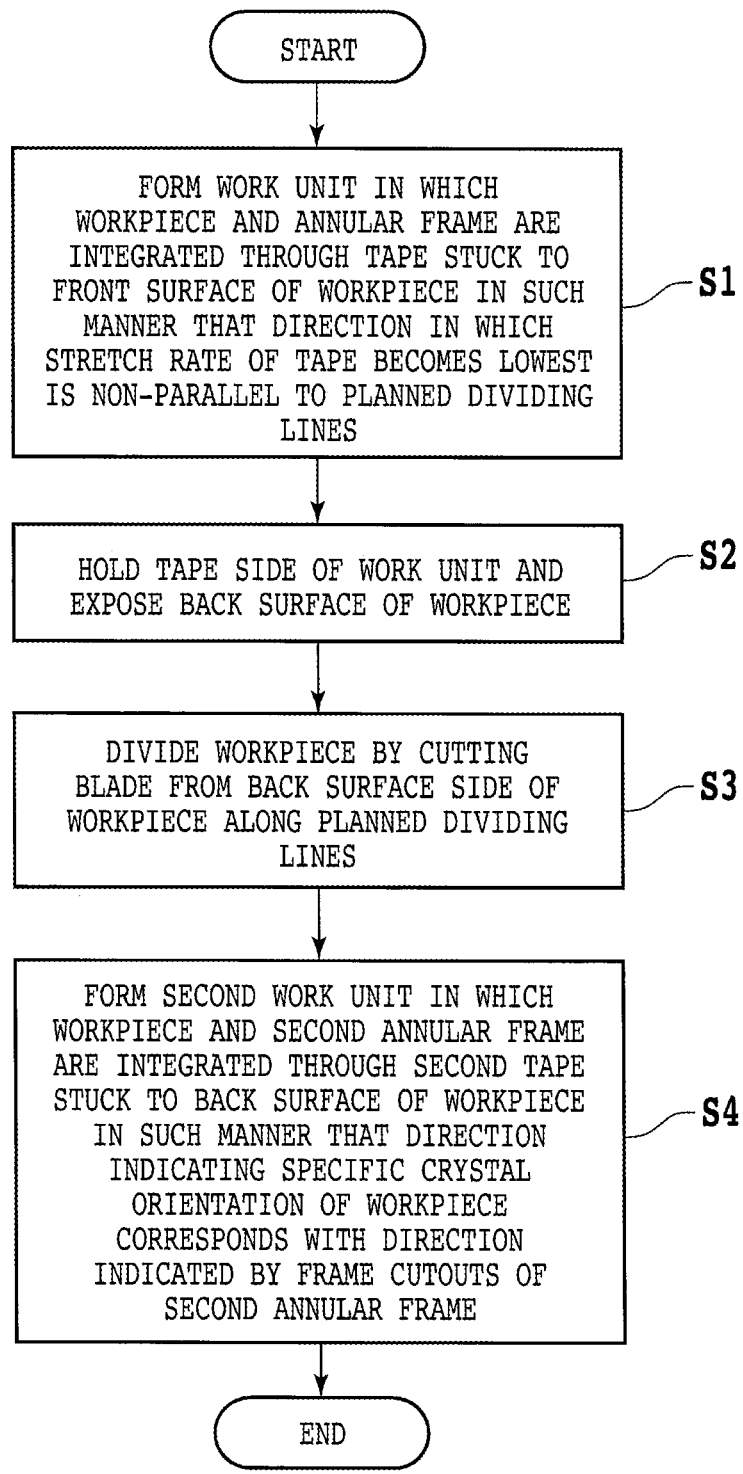
FIG. 13 is a flowchart schematically illustrating a modification example of the dividing method of a workpiece.

Moreover, the dividing method of a workpiece according to the present invention may include a step of causing a direction indicating a specific crystal orientation of the workpiece 11 to correspond with a direction indicated by frame cutouts of an annular frame (setting the angle formed by both directions to) 0° after the dividing step (S3). FIG. 13 is a flowchart schematically illustrating one example of such a dividing method of a workpiece. In this method, first, the above-described work unit forming step (S1), holding step (S2), and dividing step (S3) are sequentially executed.

Then, a second work unit in which the workpiece 11 and a second annular frame are integrated through a second tape stuck to the back surface of the workpiece 11 in such a manner that a direction indicating a specific crystal orientation of the workpiece 11 (direction from the center of the workpiece 11 toward the notch 15, for example) corresponds with a direction indicated by frame cutouts of the second annular frame is formed (second work unit forming step: S4).

Figure 14:
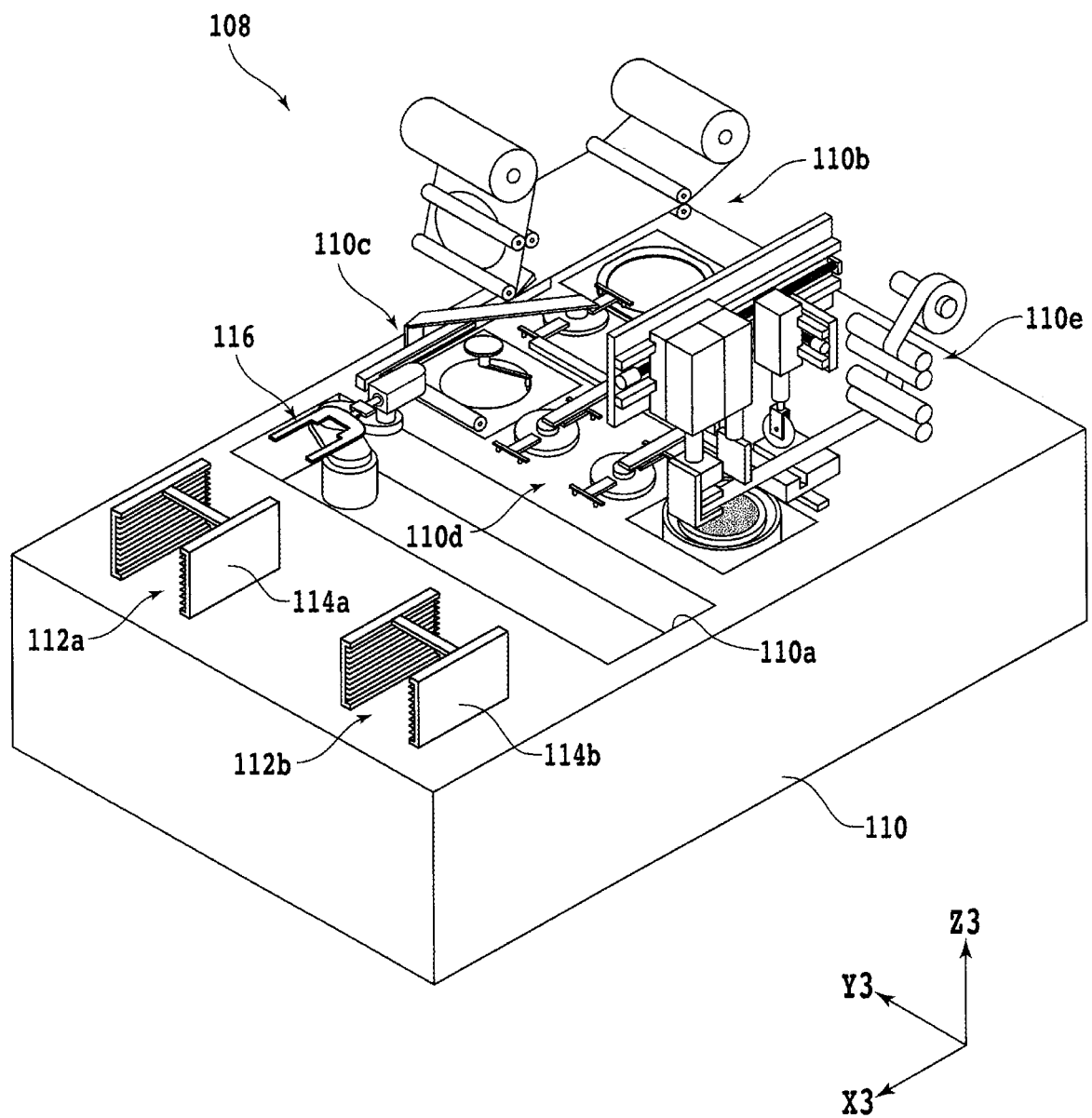
FIG. 14 is a perspective view schematically illustrating one example of a tape sticking apparatus used for executing a second work unit forming step.

FIG. 14 is a perspective view schematically illustrating one example of a tape sticking apparatus used for executing the second work unit forming step (S4). An X3-axis direction (front-rear direction) and a Y3-axis direction (left-right direction) illustrated in FIG. 14 are directions perpendicular to each other on a horizontal plane. Furthermore, a Z3-axis direction (upward-downward direction) is the direction perpendicular to the X3-axis direction and the Y3-axis direction (vertical direction).

A tape sticking apparatus 108 illustrated in FIG. 14 has a rectangular parallelepiped-shaped base 110 that supports the respective constituent elements. Two cassette placement pedestals 112a and 112b are each disposed at a pair of corners located on the front side of the upper surface of this base 110.

Furthermore, a cassette 114a that houses the work units 29 including the divided workpiece 11 is placed on the cassette placement pedestal 112a. In addition, a cassette 114b that can house the second work units formed in the tape sticking apparatus 108 is placed on the cassette placement pedestal 112b.

Moreover, an opening 110a extending along the Y3-axis direction is formed in a region in the upper surface of the base 110 located on the rear side of the two cassette placement pedestals 112a and 112b. A conveying unit 116 that conveys the work unit is disposed in this opening 110a. This conveying unit 116 has a structure similar to that of the first conveying unit 10a illustrated in FIG. 2.

Figure 15:
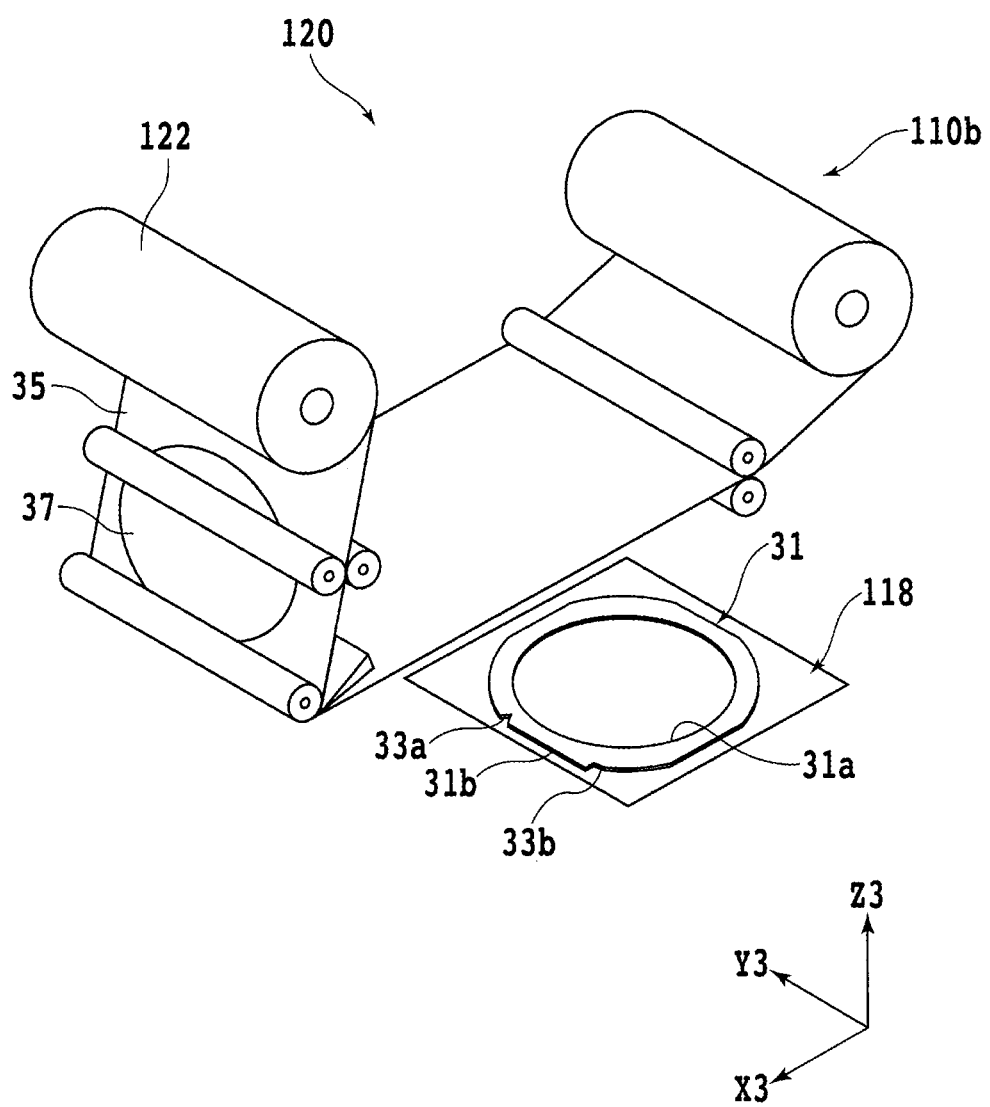
FIG. 15 is a partially enlarged perspective view schematically illustrating a tape sticking part.

Furthermore, a tape sticking part 110b is disposed at one of a pair of corners located on the rear side of the upper surface of the base 110. FIG. 15 is a partially enlarged perspective view schematically illustrating the tape sticking part 110b. A support pedestal 118 is disposed in this tape sticking part 110b, and a second annular frame 31 is placed on this support pedestal 118.

This second annular frame 31 has a structure similar to that of the annular frame 21 illustrated in FIG. 3B and so forth. In addition, the second annular frame 31 is placed on the support pedestal 118 in such a manner that a direction indicated by a pair of frame cutouts 33a and 33b (direction from the center of the opening 31a toward a straight line part 31b disposed between the pair of frame cutouts 33a and 33b) is parallel to the X3-axis direction and the straight line part 31b is located on the front side.

Moreover, a tape sticking unit 120 is disposed above the support pedestal 118. This tape sticking unit 120 has a structure similar to that of the tape sticking unit 36 illustrated in FIG. 4 and so forth. Furthermore, multiple circular second tapes 37 in the state of sticking to a release base 35 are taken up by a supply roller 122 of the tape sticking unit 120.

The diameter of each of the multiple second tapes 37 is longer than the inner diameter of the second annular frame 31 and is shorter than the sides of a square that overlaps with the straight line part 31b at the outer edge of the second annular frame 31. In addition, each of these multiple second tapes 37 has a structure similar to that of the tapes 27 illustrated in FIG. 4 and so forth, for example.

Moreover, the support pedestal 118 is coupled to an X3-axis direction movement mechanism (not illustrated) similarly to the support pedestal 20 illustrated in FIG. 4 and so forth. Furthermore, the tape sticking unit 120 is coupled to a raising-lowering mechanism (not illustrated) similarly to the tape sticking unit 36 illustrated in FIG. 4 and so forth.

Figure 16:
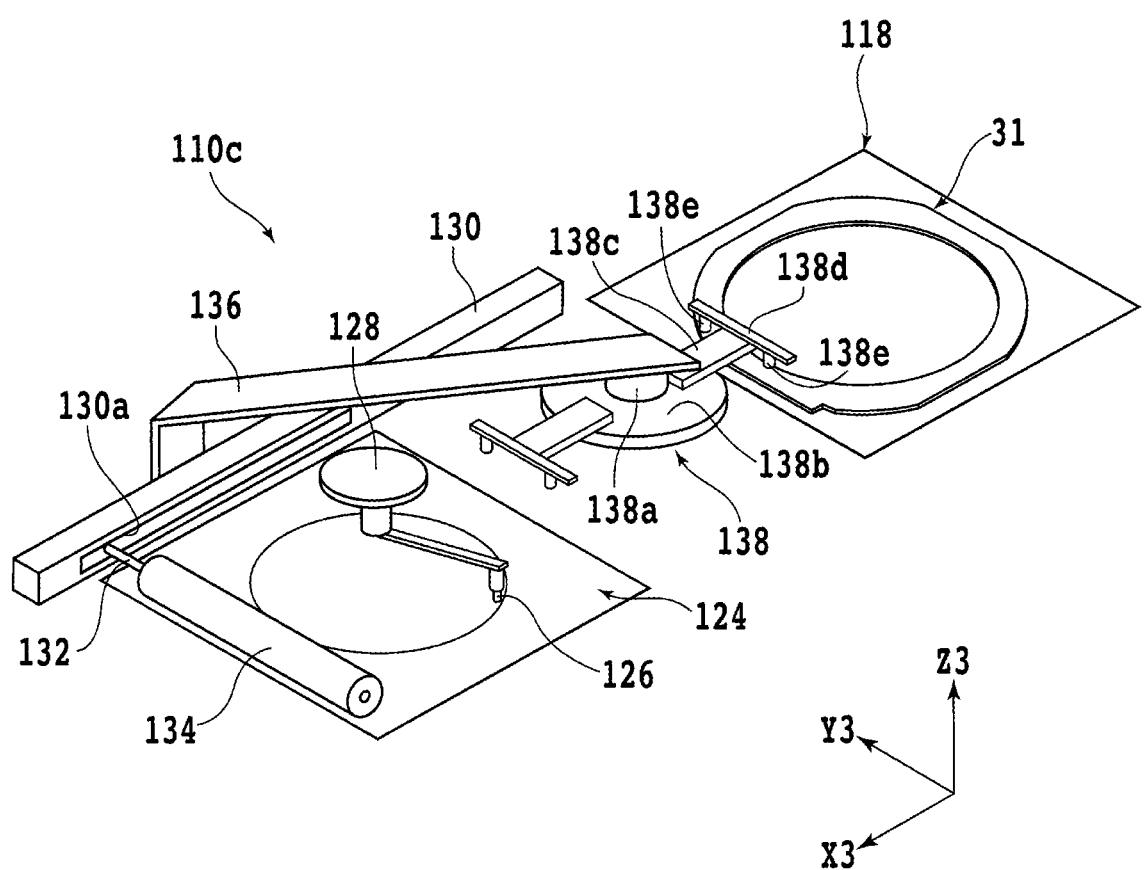
FIG. 16 is a partially enlarged perspective view schematically illustrating a work unit forming part and so forth.

Moreover, a work unit forming part 110c is disposed in a region on the front side of the tape sticking part 110b illustrated in FIG. 14. FIG. 16 is a partially enlarged perspective view schematically illustrating the work unit forming part 110c and so forth. A cutting table 124 is disposed in this work unit forming part 110c, and the work unit 29 carried out from the cassette 114a by the conveying unit 116 can be carried in to this cutting table 124.

Furthermore, above the cutting table 124, a cutter 126 that cuts the tape 27 existing between the workpiece 11 and the annular frame 21 of the work unit 29 carried in to the cutting table 124 is disposed.

This cutter 126 is coupled to a rotational drive source 128 disposed above the center of the cutting table 124, and this rotational drive source 128 causes the cutter 126 to make rotational motion with a predetermined rotation radius. In addition, the rotational drive source 128 is coupled to a raising-lowering mechanism (not illustrated).

Moreover, an X3-axis direction movement mechanism casing 130 extending along the X3-axis direction is disposed on a lateral side of the cutting table 124. In the side surface of this X3-axis direction movement mechanism casing 130 on the side of the cutting table 124, an opening 130a extending from a region on a lateral side of one end of the cutting table 124 in the X3-axis direction to a region on the lateral side of the other end is formed. A sticking roller support part 132 is caused to path through this opening 130a.

A base end part of this sticking roller support part 132 is coupled to an X3-axis direction movement mechanism (not illustrated) incorporated in the X3-axis direction movement mechanism casing 130. Furthermore, a sticking roller 134 is disposed on the part exposed from the X3-axis direction movement mechanism casing 130 in the sticking roller support part 132. Moreover, when the X3-axis direction movement mechanism coupled to the base end part of the sticking roller support part 132 operates, this sticking roller 134 moves along the X3-axis direction in such a manner as to be in contact with the upper surface of the cutting table 124.

Furthermore, an opening is formed also in the side surface on the opposite side to the side surface in which the opening 130a is formed in the X3-axis direction movement mechanism casing 130. A conveying unit support part 136 is caused to pass through this opening. A base end part of this conveying unit support part 136 is coupled to an X3-axis direction movement mechanism (not illustrated) incorporated in the X3-axis direction movement mechanism casing 130.

Moreover, the conveying unit support part 136 bends to extend to the side of the support pedestal 118 and the cutting table 124, and a conveying unit 138 is disposed on the lower side of a tip part thereof. This conveying unit 138 has a circular columnar coupling part 138a that houses an air cylinder having a piston rod (not illustrated) that can move along the Z3-axis direction. A tip part (lower end part) of this piston rod is fixed to the upper side of a coupling part 138b with a circular disc shape.

A rectangular parallelepiped-shaped coupling part 138c extending along the X3-axis direction is disposed on the upper side of each of both end parts of this coupling part 138b in the X3-axis direction. In addition, tip parts of the coupling parts 138c are each fixed to a side surface of a central part of a rectangular parallelepiped-shaped coupling part 138d extending along the Y3-axis direction.

Furthermore, suction pads 138e are disposed on the lower side of both end parts of each of these coupling parts 138d. Moreover, the suction pads 138e communicate with a suction source (not illustrated) such as a vacuum pump through a flow path (not illustrated) formed inside the coupling part 138d and so forth and a pipe communicating with this flow path.

Figure 17:
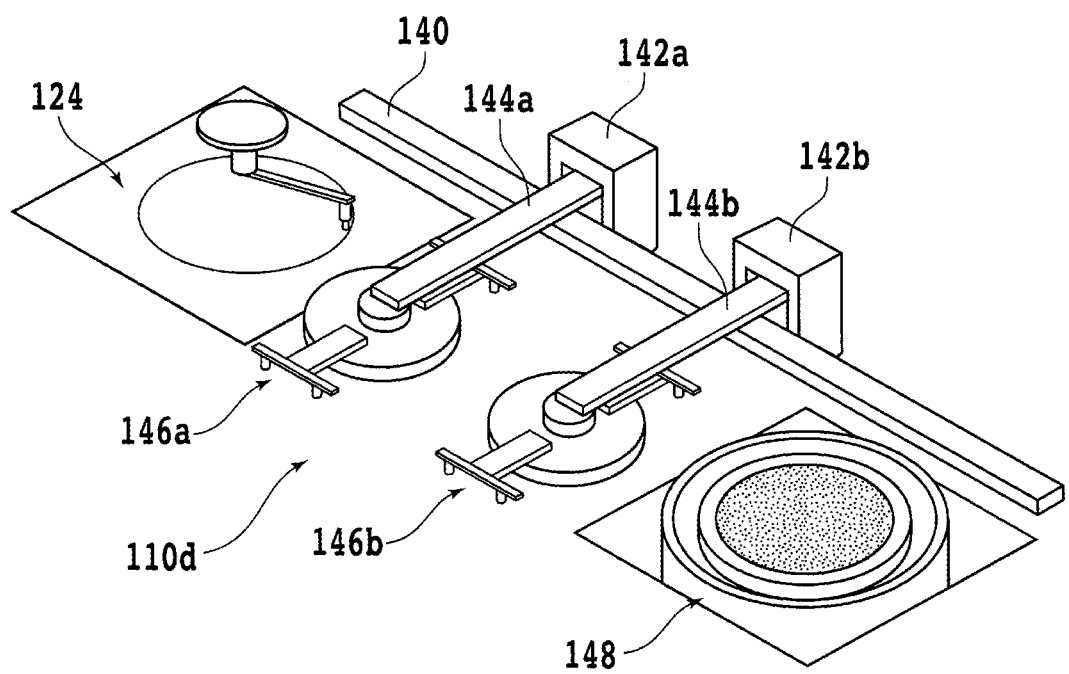
FIG. 17 is a partially enlarged perspective view schematically illustrating a conveying part and so forth.

Furthermore, a conveying part 110d is disposed in a region on a lateral side of the work unit forming part 110c illustrated in FIG. 14. FIG. 17 is a partially enlarged perspective view schematically illustrating the conveying part 110d and so forth. In this conveying part 110d, a rectangular parallelepiped-shaped Y3-axis direction movement mechanism casing 140 extending along the Y3-axis direction from a region on the rear side of the cutting table 124 to a region on the rear side of a separation table 148 to be described later is disposed.

An opening is formed in the rear surface of this Y3-axis direction movement mechanism casing 140. The front side of lower end parts of a pair of raising-lowering rotation mechanism casings 142a and 142b that each extend along the Z3-axis direction and have a rectangular parallelepiped shape is caused to pass through this opening. Moreover, a lower end part of each of the pair of raising-lowering rotation mechanism casings 142a and 142b is coupled to a Y3-axis direction movement mechanism (not illustrated) incorporated in the Y3-axis direction movement mechanism casing 140.

Furthermore, an opening is formed in the front surface of each of the pair of raising-lowering rotation mechanism casings 142a and 142b and rectangular parallelepiped-shaped conveying unit support parts 144a and 144b extending along the X3-axis direction are caused to pass through this opening. Base end parts of these conveying unit support parts 144a and 144b are coupled to raising-lowering mechanisms (not illustrated) and rotation mechanisms (not illustrated) incorporated in the raising-lowering rotation mechanism casings 142a and 142b.

These raising-lowering mechanisms raise and lower the conveying unit support parts 144a and 144b along the Z3-axis direction. Furthermore, these rotation mechanisms rotate the conveying unit support parts 144a and 144b with a straight line along the X3-axis direction being the rotation axis. Moreover, conveying units 146a and 146b are disposed on the lower side of tip parts of the conveying unit support parts 144a and 144b. These conveying units 146a and 146b have a structure similar to that of the conveying unit 138 illustrated in FIG. 16.

Figure 18:
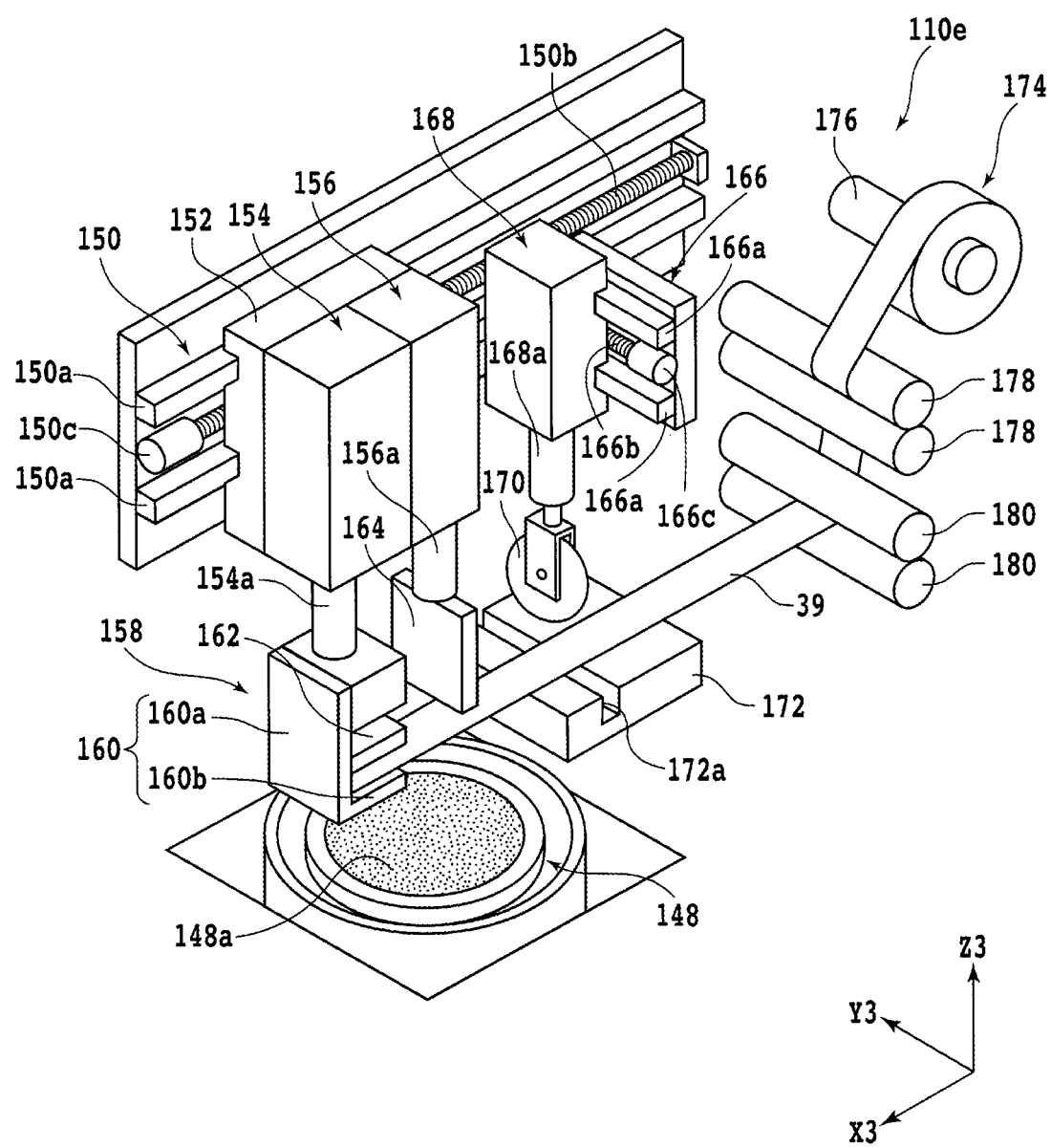
FIG. 18 is a partially enlarged perspective view schematically illustrating a separating part.

Furthermore, a separating part 110e is disposed in a region on the opposite side to the work unit forming part 110c as viewed from the conveying part 110d illustrated in FIG. 14. FIG. 18 is a partially enlarged perspective view schematically illustrating the separating part 110e. The separation table 148 is disposed in this separating part 110e. This separation table 148 has a circular disc-shaped porous plate 148a with an exposed upper surface.

This porous plate 148a communicates with a suction source (not illustrated) such as a vacuum pump through a suction path (not illustrated) formed inside the separation table 148, and so forth. Thus, when this suction source is operated in a state in which the work unit is placed over the upper surface of the porous plate 148a, the work unit is held by the separation table 148.

An X3-axis direction movement mechanism 150 is disposed above the separation table 148. This X3-axis direction movement mechanism 150 has a pair of guide rails 150a that each extend along the X3-axis direction. Furthermore, the back surface side of a moving plate 152 is slidably coupled to the front surface side of the pair of guide rails 150a. Moreover, a screw shaft 150b extending along the X3-axis direction is disposed between the pair of guide rails 150a.

A motor 150c for rotating the screw shaft 150b is coupled to a front end part of this screw shaft 150b. In addition, a nut part (not illustrated) that houses a large number of balls that roll on the surface of the screw shaft 150b that rotates is disposed on the surface in which a spiral groove is formed in the screw shaft 150b, so that a ball screw is configured.

That is, when the screw shaft 150b rotates, the large number of balls circulate in the nut part, and the nut part moves along the X3-axis direction. Furthermore, this nut part is fixed to the back surface of the moving plate 152. Thus, when the screw shaft 150b is rotated by the motor 150c, the moving plate 152 moves along the X3-axis direction together with the nut part.

A pair of air cylinders 154 and 156 are disposed to line up in the front-rear direction on the front surface of this moving plate 152. Moreover, the air cylinder 154 located on the front side has a piston rod 154a that can move along the Z3-axis direction and a grasping claw 158 that grasps a tape 39 for separation to be described later is coupled to a lower end part of this piston rod 154a.

The grasping claw 158 has an L-shaped fixed claw 160. This fixed claw 160 has a rectangular parallelepiped-shaped erected part 160a extending along the Z3-axis direction and a rectangular parallelepiped-shaped bottom part 160b extending rearward from a lower end part of this erected part 160a. Furthermore, a rectangular parallelepiped-shaped movable claw 162 that can move along the Z3-axis direction is disposed on the rear surface of this erected part 160a.

Moreover, the air cylinder 156 located on the rear side of the air cylinder 154 has a piston rod 156a that can move along the Z3-axis direction and a rectangular parallelepiped-shaped heating plate 164 that heats the tape 39 for separation to be described later is coupled to a lower end part of this piston rod 156a. A heating wire is incorporated in this heating plate 164, and the heating plate 164 is heated with focus on the vicinity of the lower surface of the heating plate 164 by generating a current in this heating wire.

In addition, a Y3-axis direction movement mechanism 166 is disposed on the rear side of the air cylinder 156. This Y3-axis direction movement mechanism 166 has a pair of guide rails 166a that each extend along the Y3-axis direction. Furthermore, the rear surface side of an air cylinder 168 is slidably coupled to the front surface side of the pair of guide rails 166a. Moreover, a screw shaft 166b extending along the Y3-axis direction is disposed between the pair of guide rails 166a.

A motor 166c for rotating the screw shaft 166b is coupled to one end part of this screw shaft 166b. In addition, a nut part (not illustrated) that houses a large number of balls that roll on the surface of the screw shaft 166b that rotates is disposed on the surface in which a spiral groove is formed in the screw shaft 166b, so that a ball screw is configured.

That is, when the screw shaft 166b rotates, the large number of balls circulate in the nut part, and the nut part moves along the Y3-axis direction. Furthermore, this nut part is fixed to the back surface of the air cylinder 168. Thus, when the screw shaft 166b is rotated by the motor 166c, the air cylinder 168 moves along the Y3-axis direction together with the nut part.

Moreover, the air cylinder 168 has a piston rod 168a that can move along the Z3-axis direction, and a cutter 170 with a circular disc shape is coupled to a lower end part of this piston rod 168a. In addition, a workbench 172 used for cutting the tape 39 for separation to be described later is disposed below the cutter 170.

A groove 172a along the Y3-axis direction is formed in this workbench 172. Furthermore, when the cutter 170 whose lower end is positioned inside the groove 172a is moved along the Y3-axis direction in a state in which the tape 39 for separation exists on the workbench 172, this tape 39 for separation is cut by the cutter 170.

Moreover, a tape-for-separation supply unit 174 is disposed on the rear side of the workbench 172. This tape-for-separation supply unit 174 has a supply roller 176. The tape 39 for separation is taken up by this supply roller 176. This tape 39 for separation has a tape base and a thermally-curable resin layer disposed on one surface (surface on the side of the supply roller 176) of this tape base.

Furthermore, a pair of inducing rollers 178 that line up along the Z3-axis direction are disposed under the supply roller 176, and the tape 39 for separation is pulled out downward by these pair of inducing rollers 178. Moreover, a pair of feed-out rollers 180 that line up along the Z3-axis direction are disposed below the pair of inducing rollers 178, and the tape 39 for separation is sent forward by these pair of feed-out rollers 180.

In the tape sticking apparatus 108 illustrated in FIG. 14, the second work unit forming step (S4) is executed in the following order, for example. Specifically, first, the second annular frame 31 is carried in to the support pedestal 118 of the tape sticking part 110b.

At this time, this second annular frame 31 is placed on the support pedestal 118 in such a manner that the direction indicated by the pair of frame cutouts 33a and 33b (direction from the center of the opening 31a toward the straight line part 31b disposed between the pair of frame cutouts 33a and 33b) is parallel to the X3-axis direction and the straight line part 31b is positioned on the front side.

Subsequently, the second tape 37 is stuck to the upper surface of the second annular frame 31 by a method similar to the above-described method for sticking the tape 27 to the annular frame 21. Next, the conveying unit 116 is operated to carry out the work unit 29 housed in the cassette 114a from the cassette 114a and carry in the work unit 29 to the cutting table 124 of the work unit forming part 110c.

At this time, the conveying unit 116 carries in the work unit 29 to the cutting table 124 in such a manner that the back surface of the workpiece 11 is oriented upward and the notch 15 is positioned on the front side as viewed from the center of the workpiece 11. This causes the direction from the center of the divided workpiece 11 toward the notch 15 to become parallel to the X3-axis direction.

Subsequently, by the cutter 126, the tape 27 is circularly cut along the outer circumference of the workpiece 11 of the work unit 29. Due to this, the work unit 29 is split into the workpiece 11 having the lower surface (front surface) to which the tape 27 with a circular disc shape sticks and the annular frame 21 having the lower surface to which the tape 27 with a circular annular shape sticks.

Next, the conveying unit 116 is operated to carry out the annular frame 21 split from the workpiece 11 from the cutting table 124 and carry in the annular frame 21 to the cassette 114a. Subsequently, the conveying unit 138 and so forth are operated to carry out the second annular frame 31 with the upper surface to which the second tape 37 sticks from the support pedestal 118 and carry in the second annular frame 31 to the cutting table 124.

Specifically, first, the X3-axis direction movement mechanism coupled to the base end part of the conveying unit support part 136 is operated to cause the suction pads 138e to be positioned directly above the second annular frame 31. Next, the air cylinder housed in the coupling part 138a is operated to bring the suction pads 138e into contact with the upper surface of the second annular frame 31 or the second tape 37 sticking to it.

Subsequently, the suction source communicating with the suction pads 138e is operated. Thereby, the second annular frame 31 is held by the suction pads 138e. Next, the air cylinder housed in the coupling part 138a is operated to raise the second annular frame 31.

Subsequently, the X3-axis direction movement mechanism coupled to the base end part of the conveying unit support part 136 is operated to cause the second tape 37 sticking to the second annular frame 31 to be positioned directly above the workpiece 11 placed over the cutting table 124.

Next, the air cylinder housed in the coupling part 138a is operated to cause the second annular frame 31 to approach the cutting table 124. Subsequently, the operation of the suction source communicating with the suction pads 138e is stopped. Through the above, the conveyance of the second annular frame 31 with the upper surface to which the second tape 37 sticks from the support pedestal 118 to the cutting table 124 is completed.

Next, the X3-axis direction movement mechanism coupled to the base end part of the sticking roller support part 132 is operated to cause the second tape 37 in contact with the upper surface (back surface) of the workpiece 11 to be pressed by the sticking roller 134. Thereby, the second tape 37 is stuck to the upper surface (back surface) of the workpiece 11, and the workpiece 11 and the second annular frame 31 are integrated.

At this time, the direction indicated by the pair of frame cutouts 33a and 33b of the second annular frame 31 (direction from the center of the opening 31a toward the straight line part 31b disposed between the pair of frame cutouts 33a and 33b) corresponds with the direction from the center of the divided workpiece 11 toward the notch 15. That is, the angle formed by the direction indicated by the pair of frame cutouts 33a and 33b of the second annular frame 31, and the direction from the center of the divided workpiece 11 toward the notch 15 is 0°.

Subsequently, the conveying units 146a and 146b and so forth of the conveying part 110d are operated to carry out the second annular frame 31 integrated with the workpiece 11 from the cutting table 124 and carry in the second annular frame 31 to the separation table 148 of the separating part 110e.

Specifically, first, the Y3-axis direction movement mechanism incorporated in the Y3-axis direction movement mechanism casing 140 is operated to cause the suction pads of the conveying unit 146a to be positioned directly above the second annular frame 31. Next, the raising-lowering mechanism incorporated in the raising-lowering rotation mechanism casing 142a is operated to cause the suction pads of the conveying unit 146a to get contact with the upper surface of the second annular frame 31 or the second tape 37 sticking to it.

Subsequently, the suction source communicating with the suction pads of the conveying unit 146a is operated. Thereby, the second annular frame 31 is held by the suction pads of the conveying unit 146a. Next, the raising-lowering mechanism incorporated in the raising-lowering rotation mechanism casing 142a is operated to raise the second annular frame 31. Subsequently, the rotation mechanism incorporated in the raising-lowering rotation mechanism casing 142a is operated to invert the conveying unit support part 144a upside down.

Thereby, the conveying unit 146a is positioned over the conveying unit support part 144a. Furthermore, the conveying unit 146a holds the second annular frame 31 integrated with the workpiece 11 in a state in which the front surface of the workpiece 11 to which the tape 27 sticks is oriented upward and the back surface of the workpiece 11 to which the second tape 37 sticks is oriented downward.

Next, the raising-lowering mechanism and/or the rotation mechanism incorporated in the raising-lowering rotation mechanism casing 142b is operated to cause the conveying unit 146b to be positioned to a position higher than the second annular frame 31 held by the conveying unit 146a and cause the conveying unit support part 144b to be positioned over this conveying unit 146b.

Subsequently, the Y3-axis direction movement mechanism incorporated in the Y3-axis direction movement mechanism casing 140 is operated to cause the raising-lowering rotation mechanism casing 142a and the raising-lowering rotation mechanism casing 142b to approach each other. Next, the raising-lowering mechanism incorporated in the raising-lowering rotation mechanism casing 142a and/or the raising-lowering mechanism incorporated in the raising-lowering rotation mechanism casing 142b is operated to bring the suction pads of the conveying unit 146b into contact with the upper surface of the second annular frame 31.

Subsequently, the operation of the suction source communicating with the suction pads of the conveying unit 146a is stopped, and the suction source communicating with the suction pads of the conveying unit 146b is operated. Thereby, the second annular frame 31 integrated with the workpiece 11 is transferred from the conveying unit 146a to the conveying unit 146b.

Next, the Y3-axis direction movement mechanism incorporated in the Y3-axis direction movement mechanism casing 140 is operated to cause the second annular frame 31 to be positioned directly above the separation table 148. Subsequently, the raising-lowering mechanism incorporated in the raising-lowering rotation mechanism casing 142b is operated to cause the second annular frame 31 to approach the separation table 148.

Next, the operation of the suction source communicating with the suction pads of the conveying unit 146b is stopped. Through the above, the conveyance of the second annular frame 31 integrated with the workpiece 11 from the cutting table 124 to the separation table 148 is completed. Due to this, the workpiece 11 with the upper surface (front surface) to which the tape 27 sticks is placed over the separation table 148 with the interposition of the second tape 37 sticking to the lower surface (back surface).

Subsequently, the tape 27 sticking to the front surface of the workpiece 11 is separated in the separating part 110e. Specifically, first, the suction source communicating with the porous plate 148a of the separation table 148 is operated. Thereby, the workpiece 11 is held by the separation table 148 with the interposition of the second tape 37. Next, the X3-axis direction movement mechanism 150 moves the moving plate 152 to cause the grasping claw 158 to approach the tape-for-separation supply unit 174.

Next, the pair of inducing rollers 178 and the pair of feed-out rollers 180 are operated to cause the tape 39 for separation to be sent out toward the grasping claw 158. Thereby, a tip part of the tape 39 for separation is positioned between the bottom part 160b of the fixed claw 160 and the movable claw 162.

Subsequently, the movable claw 162 is brought close to the bottom part 160b of the fixed claw 160 to cause the tip part of the tape 39 for separation to be clamped by the bottom part 160b of the fixed claw 160 and the movable claw 162, that is, to be grasped by the grasping claw 158. Next, the X3-axis direction movement mechanism 150 moves the moving plate 152 to cause the grasping claw 158 to be separated from the tape-for-separation supply unit 174 and to be positioned above the separation table 148.

At this time, the tape 39 for separation whose tip part is grasped by the grasping claw 158 is pulled by the grasping claw 158 and is drawn along the X3-axis direction. This grasping claw 158 is positioned to a position higher than the workbench 172. Moreover, the X3-axis direction movement mechanism 150 moves the moving plate 152 along the X3-axis direction to cause the vicinity of the outer circumference of the tape 27 sticking to the front surface of the workpiece 11 to be positioned directly below the heating plate 164.

Subsequently, the air cylinder 156 lowers the piston rod 156a to press part of the tape 39 for separation existing directly below the heating plate 164 against the tape 27. Next, a current is generated in the heating wire incorporated in the heating plate 164, and the vicinity of the lower surface of the heating plate 164 is heated. Due to this, part of the tape 39 for separation cures in a state in which it is in contact with the tape 27.

Subsequently, in order to allow a part located above the groove 172a of the workbench 172 in the tape 39 for separation to be cut by the cutter 170, the air cylinder 168 lowers the piston rod 168a and the Y3-axis direction movement mechanism 166 moves the air cylinder 168 along the Y3-axis direction.

Next, the air cylinder 154 raises the piston rod 154a to raise the grasping claw 158. This separates the tape 27 in contact with the part of the tape 39 for separation from the front surface of the workpiece 11. Moreover, the X3-axis direction movement mechanism 150 may move the moving plate 152 to cause the grasping claw 158 to move along the X3-axis direction if necessary for complete separation of the tape 27 from the front surface of the workpiece 11.

Figure 19:
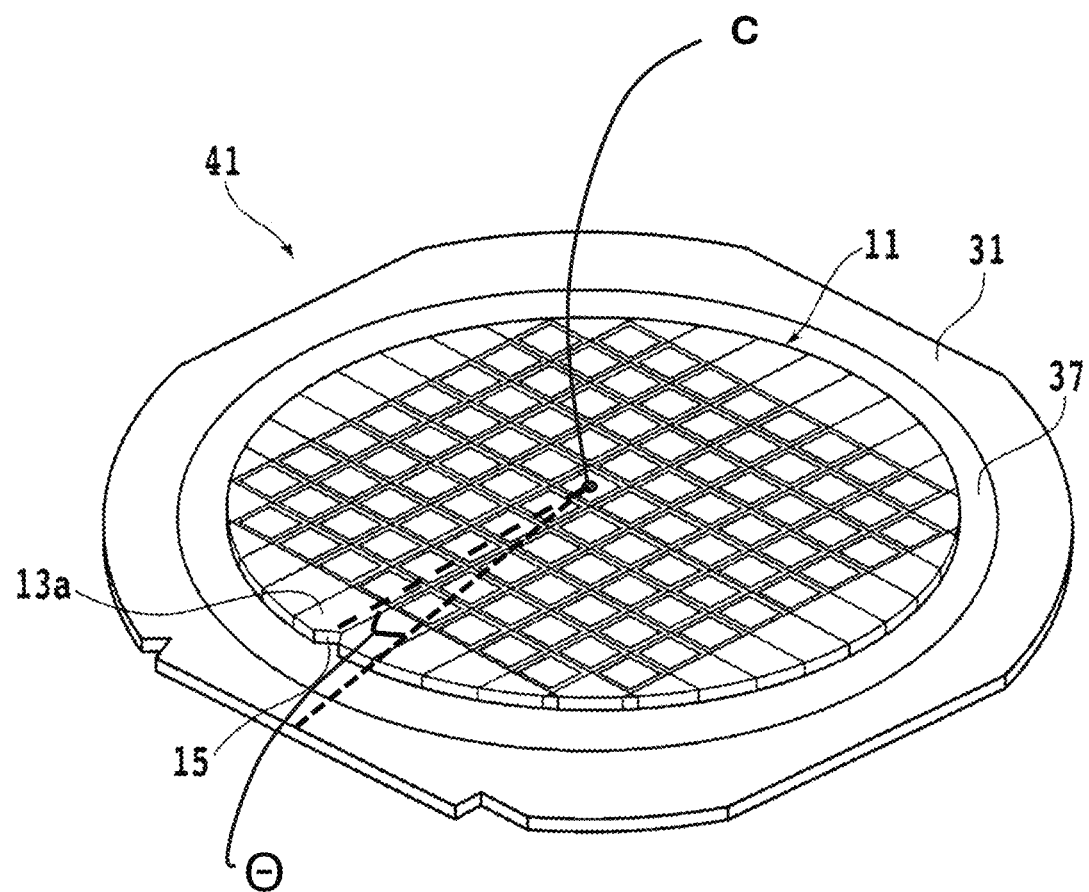
FIG. 19 is a perspective view schematically illustrating one example of a second work unit.

Through the above, the separation of the tape 27 sticking to the front surface of the workpiece 11 is completed. Due to this, the second work unit in which the workpiece 11 and the second annular frame 31 are integrated through the second tape 37 is formed. FIG. 19 is a perspective view schematically illustrating this second work unit 41. In FIG. 19, the side of the front surface of the workpiece 11 (front surface 13a of the substrate 13) is illustrated.

Subsequently, the operation of the suction source communicating with the porous plate 148a of the separation table 148 is stopped. Next, the conveying unit 116 is operated to carry out the second work unit 41 from the separation table 148 and carry in the second work unit 41 to the cassette 114b. Through the above, the second work unit forming step (S4) is completed.

In the dividing method of a workpiece illustrated in FIGS. 13 and 19 including this second work unit forming step (S4), the direction from the center C of the divided workpiece 11 toward the notch 15 is made to correspond with the direction indicated by the pair of frame cutouts 33a and 33b of the second annular frame 31 (direction from the center C of the opening 31a toward the straight line part 31b disposed between the pair of frame cutouts 33a and 33b) (the angle Θ formed by both directions is set to 0°). This facilitates position adjustment of the workpiece 11 when treatment is executed for the workpiece 11 after the second work unit forming step (S4).

The above-described contents are one aspect of the present invention and inventions having different characteristic from the above-described contents are also included in the present invention. For example, the second annular frame used in the second work unit forming step (S4) may be the same one as the annular frame 21 used in the work unit forming step (S1).

That is, a different annular frame from the annular frame 21 does not need to be prepared as this second annular frame. Specifically, the second work unit forming step (S4) included in the dividing method of a workpiece according to the present invention may be executed in the following order.

First, without splitting the workpiece 11 and the annular frame 21 through the tape 27 sticking to the front surface of the workpiece 11 and one surface of the annular frame 21, the second tape 37 is stuck to the back surface of this workpiece 11 and the other surface of the annular frame 21. Then, the tape 27 sticking to the front surface of the workpiece 11 and the one surface of the annular frame 21 is separated. In this case, trouble of the second work unit forming step can be reduced.

On the other hand, when the second annular frame used in the second work unit forming step (S4) is different from the annular frame 21 used in the work unit forming step (S1), as described above, the part other than the part sticking to the front surface of the workpiece 11 in the tape 27 can be removed in advance before the tape 27 is separated from the front surface of the workpiece 11. Thus, the probability that the tape 27 remains on the second work unit 41 formed by separating the tape 27 from the front surface of the workpiece 11 can be reduced.

Furthermore, in the second work unit forming step (S4), the direction from the center of the divided workpiece 11 toward the notch 15 does not need to correspond with the direction indicated by the pair of frame cutouts 33a and 33b of the second annular frame 31. That is, the angle formed by both directions does not need to be 0°. For example, in the second work unit forming step (S4), the second tape 37 sticking to the second annular frame 31 may be stuck to the back surface of the workpiece 11 in such a manner that the angle formed by both directions is 90°, 180°, or 270°.

Besides, structures, methods, and so forth according to the above-described embodiment can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A dividing method of a workpiece, in which the workpiece that is segmented into a plurality of regions by a plurality of first planned dividing lines each extending along a first direction and a plurality of second planned dividing lines each extending along a second direction intersecting the first dividing lines extending in the first direction, the workpiece having a device formed on a side of a front surface of each of the plurality of regions is divided by a cutting blade from a back surface of the workpiece along each of the plurality of first planned dividing lines and each of the plurality of second planned dividing lines, the dividing method comprising:
   a first work unit forming step of forming a first work unit in which the workpiece and a first annular frame are integrated by sticking a first tape to the first annular frame in such a manner as to cover an opening of the first annular frame and sticking the first tape to the front surface of the workpiece;
   a holding step of holding a side of the first tape of the first work unit by a holding table and exposing the back surface of the workpiece after the first work unit forming step; and
   a dividing step of dividing the workpiece by the cutting blade from the side of the back surface along each of the plurality of first planned dividing lines and each of the plurality of second planned dividing lines after the holding step,
   wherein in the first work unit forming step, the first tape is oriented relative to the workpiece and stuck to the front surface of the workpiece so that an angle formed between a straight line extending along a third direction on the first tape representing where the stretch rate of the first tape is the lowest when a predetermined force is applied to the first tape, and a straight line extending along the first direction of the first dividing lines or a straight line extending along the second direction of the second dividing lines is 45 degrees.

2. The dividing method of the workpiece according to claim 1, wherein
   the first direction is orthogonal to the second direction, and,
   in the first work unit forming step, the first tape is stuck to the front surface of the workpiece in such a manner that an angle formed by the straight line extending along the third direction and each of a straight line extending along the first direction and a straight line extending along the second direction is 45 degrees.

3. The dividing method of the workpiece according to claim 1, the dividing method further comprising:
   after the dividing step, a second work unit forming step of forming a second work unit in which the workpiece and a second annular frame having an outer edge at which a frame cutout is formed, are integrated by separating the first tape from the workpiece after sticking a second tape to the second annular frame in such a manner as to cover an opening of the second annular frame and sticking the second tape to the back surface of the workpiece, wherein
   a notch or a straight line part for indicating a crystal orientation is formed at an outer edge of the workpiece, and,
   in the second work unit forming step, the second tape sticking to the second annular frame is stuck to the back surface of the workpiece in such a manner that an angle formed between a straight line extending in a direction from a center of the workpiece toward the notch or the straight line part, and a straight line extending in a direction from the center of the workpiece toward the frame cutout is 0°, 90°, 180°, or 270°.

4. The dividing method of the workpiece according to claim 2, the dividing method further comprising:
   after the dividing step, a second work unit forming step of forming a second work unit in which the workpiece and a second annular frame having an outer edge at which a frame cutout is formed are integrated by separating the first tape from the workpiece after sticking a second tape to the second annular frame in such a manner as to cover an opening of the second annular frame and sticking the second tape to the back surface of the workpiece, wherein a notch or a straight line part for indicating a crystal orientation is formed at an outer edge of the workpiece, and, in the second work unit forming step, the second tape sticking to the second annular frame is stuck to the back surface of the workpiece in such a manner that an angle formed between a straight line extending in a direction from a center of the workpiece toward the notch or the straight line part, and a straight line extending in a direction from the center of the workpiece toward the frame cutout is 0°, 90°, 180°, or 270°.

\* \* \* \* \*